(12) United States Patent
Reznicek et al.

(10) Patent No.: US 11,189,701 B1
(45) Date of Patent: Nov. 30, 2021

(54) BIPOLAR JUNCTION TRANSISTOR WITH VERTICALLY INTEGRATED RESISTOR

(71) Applicant: International Business Machines Corporation, Armonk, NY (US)

(72) Inventors: Alexander Reznicek, Troy, NY (US); Bahman Hekmatshoartabari, White Plains, NY (US); Karthik Balakrishnan, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/118,819

(22) Filed: Dec. 11, 2020

(51) Int. Cl.
| | |
|---|---|
| H01L 29/417 | (2006.01) |
| H01L 29/737 | (2006.01) |
| H01L 29/66 | (2006.01) |
| H01L 29/10 | (2006.01) |
| H01L 29/73 | (2006.01) |

(52) U.S. Cl.
CPC .... H01L 29/41708 (2013.01); H01L 29/1004 (2013.01); H01L 29/66287 (2013.01); H01L 29/7304 (2013.01); H01L 29/7371 (2013.01)

(58) Field of Classification Search
CPC ........... H01L 29/41708; H01L 29/7304; H01L 29/7371; H01L 29/1004; H01L 29/66287; H01L 27/0652; H01L 27/0658
See application file for complete search history.

(56) References Cited

U.S. PATENT DOCUMENTS

| | | | |
|---|---|---|---|
| 3,761,786 A | 9/1973 | Imaizumi et al. | |
| 4,982,257 A | 1/1991 | Akbar et al. | |
| 5,047,826 A | 9/1991 | Keller et al. | |
| 5,578,854 A | 11/1996 | Chen et al. | |
| 6,043,520 A * | 3/2000 | Yamamoto | H01L 29/7304 257/197 |
| 6,465,870 B2 | 10/2002 | Voidman | |
| 8,815,654 B2 | 8/2014 | Gauthier, Jr. et al. | |
| 9,859,172 B1 | 1/2018 | Anderson et al. | |
| 9,905,678 B2 * | 2/2018 | Zampardi | H01L 29/737 |
| 10,332,972 B2 | 6/2019 | Balakrishnan et al. | |
| 10,424,650 B2 | 9/2019 | Balakrishnan et al. | |
| 2001/0013634 A1 | 8/2001 | Patti | |
| 2014/0167115 A1* | 6/2014 | Obu | H01L 21/8252 257/197 |
| 2018/0145158 A1 | 5/2018 | Berglund et al. | |
| 2019/0189745 A1* | 6/2019 | Balakrishnan | H01L 29/66553 |

OTHER PUBLICATIONS

T. H. Ning, "A Perspective on SOI Symmetric Lateral Bipolar Transistors for Ultra-Low-Power Systems," IEEE Journal of the Electron Devices Society, vol. 4, No. 5, 2016, pp. 227-235.

* cited by examiner

*Primary Examiner* — Syed I Gheyas
(74) *Attorney, Agent, or Firm* — Daniel P. Morris; Lou Percello, Attorney, PLLC

(57) ABSTRACT

Vertical bipolar junction transistors (VBJTs), each with one or more resistors connected in a circuit in different circuit configurations, are disclosed. The VBJT has an emitter substructure that includes an emitter layer, a collector, an intrinsic base, one or more doped epitaxy regions, and one or more resistors. The intrinsic base, the doped epitaxy region(s), and the resistor(s) are stacked upon one another in a channel between the emitter layer and the collector. Various circuit configurations and structures are described including a common-collector circuit, a common-emitter circuit, and an emitter-degenerate circuit. Methods of making these configuration/structures are disclosed.

20 Claims, 24 Drawing Sheets

BIPOLAR JUNCTION TRANSISTOR WITH VERTICALLY INTEGRATED RESISTOR

BACKGROUND

The present invention relates to integrating passive electrical devices with transistors. More specifically, the invention relates to integrating a resistor with a bipolar junction transistor in a vertical structure.

A resistor is a well-known electrical component that limits or regulates the flow of electrical current in an electronic circuit. Resistors can be active resistors (e.g. diode-connected transistors) or passive resistors.

Compared to active resistors, passive resistors have higher temperature stability, higher linearity (i.e. higher bias stability), and lower noise. Therefore, passive resistors are preferred for applications such as biasing high-gain amplifiers or analog computation units where small variations in bias may significantly drift the output. Integrating passive resistors with transistors is fundamental in many circuit applications.

However, a major issue associated with the monolithic integration of passive resistors with transistors in circuitry is the large area these passive resistors use in the circuit floor plan. Since passive resistor resistance values are generally larger or much larger than the ON resistance of transistors, more material and therefore larger circuit surface areas is used by these passive resistors.

Bipolar junction transistors (BJTs) have a high drive current at a given operation voltage. This gives BJTs an advantage when used in certain applications like ultra-low-power systems. Further, BJTs are used in many standard circuit building blocks. For example, BJTs are used in common-collector circuits (e.g. analog voltage buffers), common-emitter circuits (e.g. analog voltage amplifiers or digital inverters/NOT gates), and emitter-degenerate circuits (e.g. analog voltage amplifiers or digital inverters).

Accordingly, there is a need to integrate passive resistors with active components like BJTs where the passive resistor uses a minimum of surface area in the circuitry.

SUMMARY

According to the present invention, a plurality of embodiments of vertical bipolar junction transistors (VBJTs), each with one or more resistors connected in a circuit, are disclosed. The VBJT and VBJT circuitry has an emitter substructure that includes an emitter layer made from an emitter semiconductor, a collector made of a collector semiconductor, an intrinsic base made of an undoped semiconductor or a moderately doped semiconductor, one or more doped epitaxy regions made of a highly doped semiconductor, and one or more resistors. The intrinsic base, the doped epitaxy region(s), and the resistor(s) are stacked upon one another in a channel in different configurations between the emitter layer and the collector.

Various circuit configurations and structures are described including a common-collector circuit, a common-emitter circuit, and an emitter-degenerate circuit. Methods of making these configuration/structures are disclosed.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

DETAILED DESCRIPTION

Figure 1:
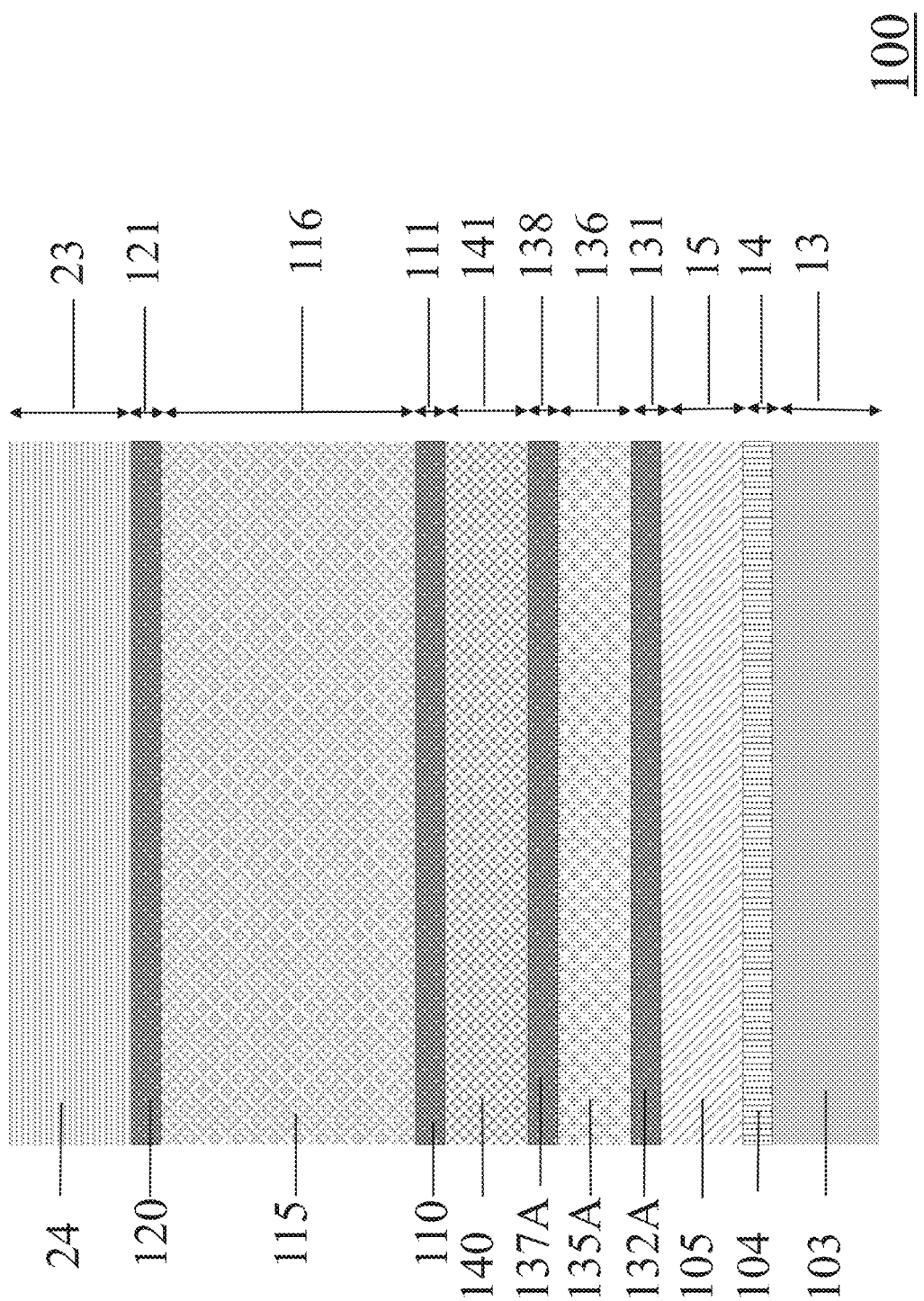
FIG. 1 is a cross section view of an interim multi-layer stack structure used to form a passive resistor (e.g. resistor) vertically stacked with a bipolar junction transistor (BJT) in a common-collector circuit.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the views, and "horizontal" refers to a direction parallel to the top surface of the substrate in the views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Disclosed are structures, devices, and methods for monolithic integration of vertical passive resistors with vertical bipolar junction transistors (VBJT). The invention substantially reduces area consumption of the passive resistors used in this circuitry.

The resistance value of a passive resistor is given by $R_L = \rho L/A$, where $\rho$ is the resistivity of the material of the passive resistor, L the length of the resistor in the direction of current flow, and A the cross-sectional area of the resistor perpendicular to current flow. The vertical structure of the present invention allows L (i.e. height of the resistor structure) to be arbitrarily large, while A (i.e. the footprint of the resistor/transistor pair) to be small, both large L and small A simultaneously favoring large R.

When used in large scale circuits, the invention provides huge space savings compared to the planar (i.e. horizontal oriented) resistors used in prior art. In addition, the length of passive resistor can be designed according to resistive needs, e.g. made taller or shorter, without having impact on device footprint. In some embodiments, epitaxial growth of the resistive region enables multiple ways to tune the resistor to the desired resistance, e.g. by controlling dopant species, co-dopants, doping level, and epitaxy thickness and size. Embodiments of the invention include vertically oriented or stacked devices with four terminals.

FIG. 1 is a cross section view of an interim multi-layer stack structure 100 used to form a passive resistor (e.g. resistor) vertically stacked with a bipolar junction transistor (BJT) in a common-collector circuit.

The common-collector circuit interim multi-layer stack structure embodiment 100 includes a supporting substrate 103, with a supporting substrate thickness 13; a punch through stop (PTS) layer 104 (doped with a dopant opposite to that of the emitter region layer 105), with a PTS layer thickness 14, disposed on the supporting substrate 103; and a heavily doped emitter region layer 105, with a emitter region layer thickness 15 (in some embodiments connected to ground). The emitter region layer (or emitter layer) 105 is disposed atop the PTS layer 104.

The material making the supporting substrate 103 includes one or more semiconductor materials, e.g. bulk semiconductor materials. Non-limiting examples of suitable supporting substrate 103 materials include Si (silicon), strained Si, Si:C (carbon doped silicon), Ge (germanium), SiGe (silicon germanium), SiGe:C (carbon doped silicongermanium), Si alloys, Ge alloys, III-V semiconductor materials (e.g., GaAs (gallium arsenide), InAs (indium arsenide), InP (indium phosphide), or Indium Gallium Arsenide (InGaAs), or any combination thereof.

The supporting substrate 103 has a supporting substrate thickness 13 between 600 and 1000 microns. Other thicknesses 13 are envisioned.

The PTS layer 104 can be formed on the upper surface of the supporting substrate 103 by ion implantation or by epitaxial growth in combination with "in situ" doping or ion implantation. The PTS layer 104 thickness 14 can be between 50 nanometers (nm) to 150 nm.

The emitter layer 105 is made from a semiconductor material. In some embodiments, the emitter layer 105 is formed epitaxial growth in combination in situ doping. In some embodiments, the emitter layer 105 thickness 15 is between about 10 nm to about 100 nm.

In some embodiments, the emitter layer 105 is an epitaxial grown layer made of a silicon material like n-doped silicon. The emitter layer 105 is highly doped with an n-type dopant selected from a group of phosphorus (P), arsenic (As) and antimony (Sb). In a non-limiting example, the dopant concentration ranges between $4 \times 10^{20}$ cm$^{-3}$ and $2.5 \times 10^{21}$ cm$^{-3}$.

Figure 15:
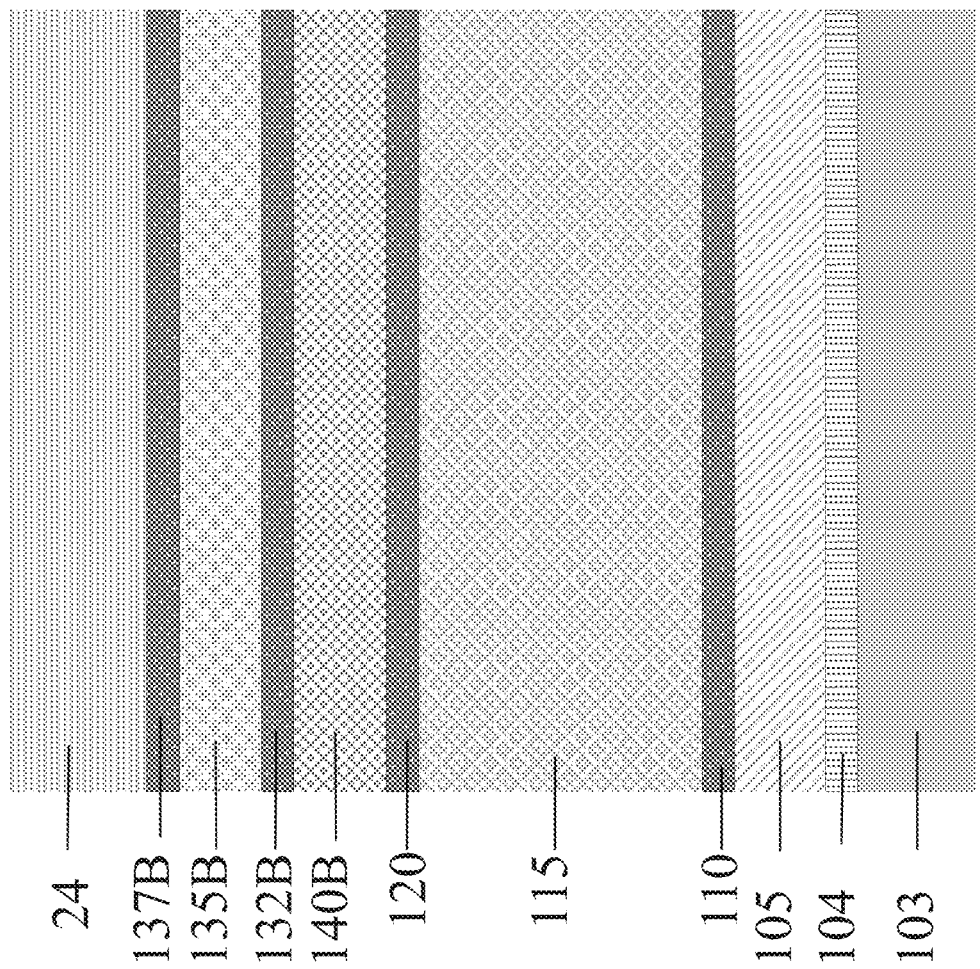
FIG. 15 is a cross section view of an interim multi-layer stack structure used to form a passive resistor (e.g. resistor) vertically stacked with a bipolar junction transistor (BJT) in a common-emitter circuit.
Figure 20:
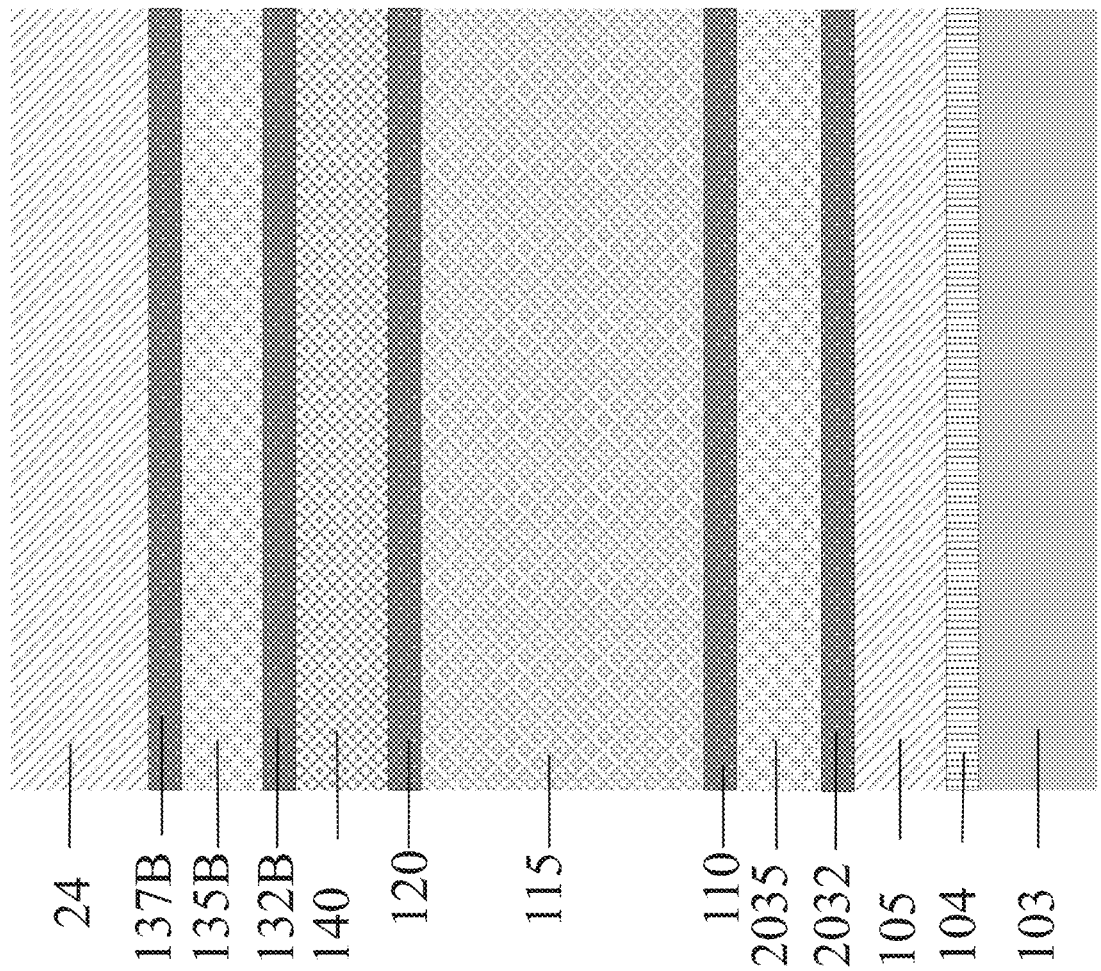
FIG. 20 is a cross section view of an interim multi-layer stack structure used to form an upper and a lower passive resistor (e.g. resistors) vertically stacked with a bipolar junction transistor (BJT) in an emitter-degenerate circuit.

FIGS. 1, 15, and 20 each disclosed an initial interim multi-layer stack structure 100/1500/2000. These related but different stack structures 100/1500/2000 are used to create three respective alternative structures/devices of the invention.

In addition, the structures disclosed 100/1500/2000 are based on Group IV semiconductors. Given this disclosure, similar structures can be made with III-V compound semiconductors using known MOCVD growth techniques that are contemplated without loss of generality but not disclosed in detail here.

Each of these structures 100/1500/2000 is formed on an emitter substructure 103/104/105, just described, i.e. the supporting substrate 103, the PTS layer 104, and the emitter layer 105. Each of the alternative structures/devices has different ordering and selection of layers disposed on the emitter substructure 103/104/105, as described below. Other embodiments are envisioned.

The description of the common-collector circuit embodiments starting with the structure 100 of FIG. 1 now continues.

Continuing with the description of common-collector circuit interim multi-layer stack structure 100, interim resistor substructure 132A/135A/137A layers are disposed on the emitter substructure. The interim resistor substructure 132A/135A/137A is made of a resistor lower spacer 132A, with a resistor lower spacer thickness 131; a resistor dielectric layer 135A, with a resistor dielectric layer 135A thickness 136; and a resistor upper spacer 137A, with a resistor upper spacer 137A thickness 138.

In this embodiment, the resistor lower spacer 132A is disposed on the emitter layer 105, the resistor dielectric layer 135A is disposed on the resistor lower spacer 132A, and the resistor upper spacer 137A is disposed on the resistor dielectric layer 135A.

Each of the resistor lower spacer 132A, the resistor dielectric layer 135A, and the resistor upper spacer 137A is made of a dielectric material like an oxide (e.g. $SiO_x$) or a nitride (e.g., silicon nitride, $Si_xN_y$) or dielectric oxynitride (e.g. SiOCN, or SiBC). Other dielectric materials employed in semiconductor devices are also envisioned.

In some embodiments, the layers/spacers 132A/135A/137A are made of a silicon nitride or oxynitride deposited by a process like chemical vapor deposition (CVD) or physical vapor deposition (PVD) or plasma enhanced chemical vapor deposition (PECVD).

The composition of these dielectric layers 132A/135A/137A can be selected to provide for selective etching between these layers 132A/135A/137A and/or the adjacent and/or other layers in the initial interim multi-layer stack structure 100/1500/2000. ("Selective etching" means that one material is removed by an etching step while another material is selectively and substantially not etched by the same etching step.)

The resistor lower spacer 132A thickness 131 and the resistor upper spacer 137A thickness 138 are approximately between 5 nm and 20 nm, with 6 nm to 12 nm a preferred thickness.

The resistor dielectric layer 135A thickness 136 depends on the length of the resistor. Accordingly, for the same cross section are of the resistor dielectric layer 135A, the resistance of the resistor can be increased/decreased by increasing/decreasing the length $R_L$ 136 of the resistor as determined by thickness 136 of the resistor dielectric layer 135A. In some alternative embodiments, the resistor length $R_L$ 136 is measured as the distance between the center lines (not shown) of the resistor lower spacer 132A and the resistor upper spacer 137A.

In this common-collector circuit interim multi-layer stack structure 100 embodiment, a dummy contact layer 140 is deposited on the resistor upper spacer 137A. The dummy contact layer 140 is made of a sacrificial material that is removed selectively from the dummy layer 115, as described below.

The dummy contact layer 140 is deposited by known processes like CVD, PVD, PECVD, atomic layer deposition (ALD), metal organic chemical vapor deposition (MOCVD), room temperature chemical vapor deposition (RTCVD), high density plasma chemical vapor deposition (HDPCVD) and combinations thereof.

In some embodiments, the dummy contact layer 140 is made of a silicon material like amorphous silicon, α-Si, or amorphous germanium, α-Ge, or amorphous silicon-germanium, α-SiGe, and has a dummy contact layer thickness 141 approximately between 10 and 60 nm.

In this common-collector circuit interim multi-layer stack structure 100 embodiment, a "tri-layer dummy stack" 110/115/120 is deposited on the metal contact layer 140. The tri-layer dummy stack 110/115/120 is made of a base lower spacer 110 (with a base lower spacer 110 thickness 11), a dummy layer 115 (with a dummy layer 115 thickness 116), and a base upper spacer 120 (with a base upper spacer 120 thickness 121).

The materials making the base lower spacer 110 and base upper 120 spacer are selectively etchable from the material of the dummy layer 115. For example, the tri-layer dummy stack 110/115/120 can be made by layering the base lower spacer 110 made of silicon nitride ($Si_xN_y$), then layering the dummy layer 115 made of silicon oxide ($SiO_x$), then layering the base upper spacer 120 made of silicon nitride ($Si_xN_y$). In alternative embodiments, the order can be changed, for example, the base lower spacer 110 ($SiO_x$), dummy layer 115 ($Si_xN_y$), and base upper spacer 120 ($SiO_x$). The dummy layer 115 is a sacrificial layer that is selectively etchable from the material making the metal contact layer 140.

In some embodiments, the resistor lower spacer 132A, the resistor upper spacer 137A, the base lower spacer 110, and base upper 120 spacer are made of the same materials. Non-limiting examples of these materials include low-k materials. Here, the term "low-k" denotes a dielectric material having a dielectric constant equal to the dielectric constant of silicon oxide ($SiO_2$) or less. Examples of low-k dielectric material suitable for spacers include diamond like carbon (DLC), organosilicate glass (OSG), fluorine doped silicon dioxide, carbon doped silicon dioxide, carbon doped silicon nitride, porous silicon dioxide, porous carbon doped silicon dioxide, boron doped silicon nitride (SiBN), carbon boron doped silicon nitride (SiBCN), SiOCN, SiCN, SiOC, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

The base lower spacer 110, dummy layer 115, and base upper layer spacer 120 materials are deposited by known deposition processes, including as non-limiting examples, CVD, PVD, ALD, MOCVD, RTCVD, HDPCVD, plasma enhanced chemical vapor deposition (PECVD), inductively coupled plasma chemical vapor deposition (ICP CVD), or any combination thereof.

The base lower spacer 110 thickness 111 and base upper layer spacer 120 thickness 121 are approximately between 5 nanometers (nm) and 20 nm or 6 nm and 12 nm. The dummy layer 115 has a thickness 116 between 50 nm and 300 nm.

A cap dielectric layer 24 is formed on the base upper layer spacer 120. The cap dielectric layer 24, as a non-limiting example, is made of an oxide, such as silicon oxide ($SiO_x$). In some embodiments, the cap dielectric layer 24 is made of a material that can be removed by an etch process selective to the base upper layer spacer 120. The base upper layer spacer 120 protects the sacrificial dummy layer 115 from being etched by the process steps that remove the cap dielectric layer 24. Non-limiting examples of other materials used to make the cap dielectric layer 24 include oxides like tetraethylorthosilicate (TEOS) oxide, high aspect ratio plasma (HARP) oxide, high temperature oxide (HTO), and high-density plasma (HDP) oxide.

Figure 2:
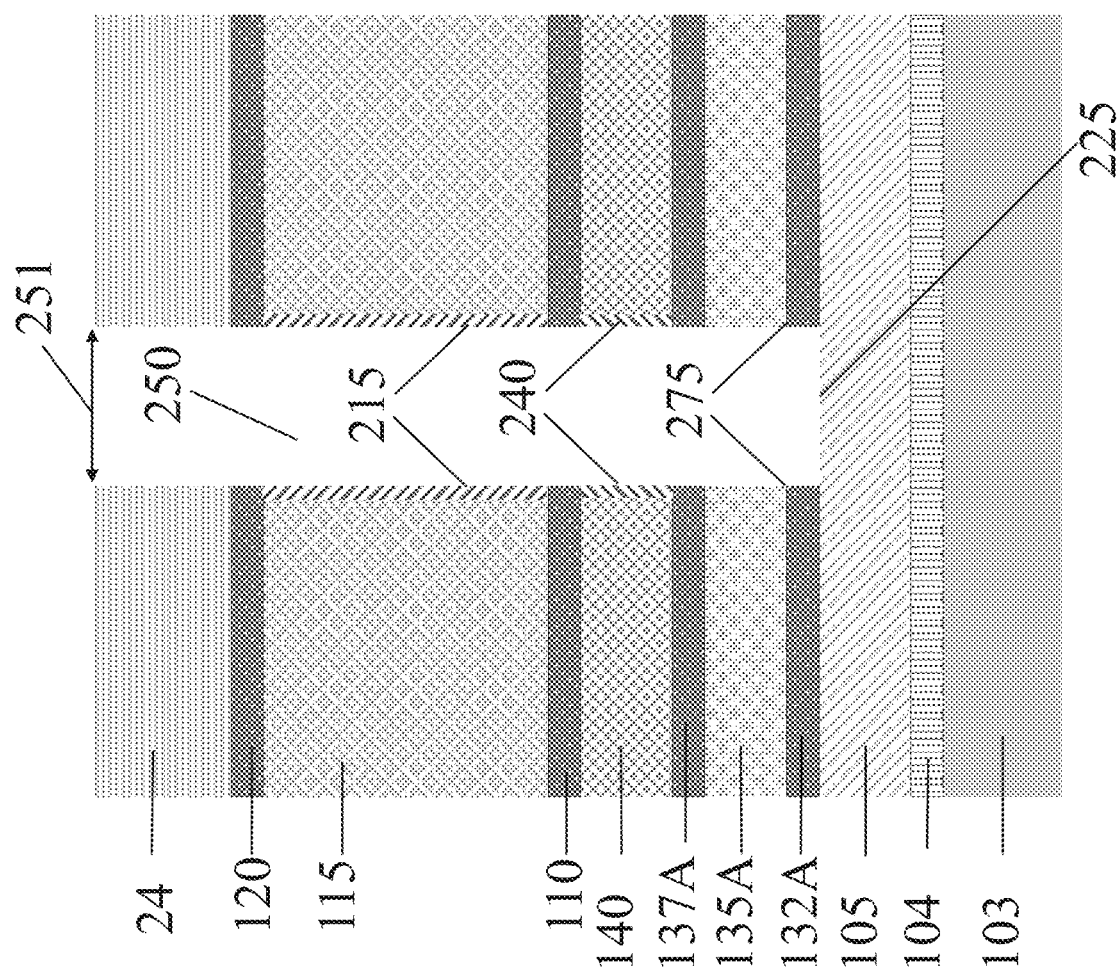
FIG. 2 is a cross section view of an interim multi-layer stack structure of the initial interim common-collector circuit embodiment of FIG. 1, after a trench is etched and a thin oxide layer is formed on dummy layer surfaces exposed to the trench opening.

FIG. 2 is a cross section view of an interim multi-layer stack structure 200 of the common-collector circuit embodiment of FIG. 1 after a trench is etched to/through the resistor lower spacer 132A and a thin oxide layer 215 is formed on dummy layer 115 surfaces exposed to the trench opening 250.

In some embodiments, the trench 250 is etched using a process, e.g. a reactive ion etch (RIE) or a series of RIE steps, that is (are) selective to the layers being etched away by the (series of) etching(s). Etching of trenches 250 is known.

The initial etch (or etch steps) etches the trench 250 down to and selective to the resistor lower spacer 132A, i.e. the etching stops at the surface and does not remove (not shown) the portion of the resistor lower spacer 132A within the trench 250.

As a non-limiting example illustrating the trench 250 etch, a first etch (selective to the dummy layer 115 material) removes the portion of the cap dielectric layer 24 and base upper layer spacer 120 material within the trench 250, a second etch (selective to the base lower layer spacer 110 material) removes the portion of the dummy layer 115 within the trench 250, a third etch (selective to the resistor upper spacer 137A) removes the portion of the metallic layer 140 within the trench 250, and a forth etch (selective to the resistor lower spacer 132A) removes the portion of the resistor dielectric layer 135A within the trench 250.

The surfaces 275 of the trench 250 are then exposed to an oxidation process, e.g. like a plasma oxidation or other known oxidation method. The oxidation step proceeds with parameters (e.g. time, temperature, etc.) to form a thin oxide layer 215 on the surface of the poly crystalline silicon layer 115 that is part of trench 250 surface 275 and a thin oxide layer 240 on the surface of the dummy contact layer 140 that is also part of the trench 250 surface. The thickness of the thin oxide layers 215/240 is between 2 nm and 3 nm. An oxide layer does not form on the surfaces 275 of dielectric layers 135A/137A/110/120/24 or on the resistor lower spacer 132A.

After formation of the thin oxide layer 215, the etch continues to remove the portion of the resistor lower spacer 132A within the trench 250 and to expose the emitter layer 105 surface 225 within the trench 250. This etch step is selective to the material in the emitter layer 105, i.e. the etch stops at the exposed emitter layer 105 surface 225.

The width of the trench (trench width) 251 can be about 6 nm to about 250 nm, or about 6 nm to about 100 nm.

Figure 3:
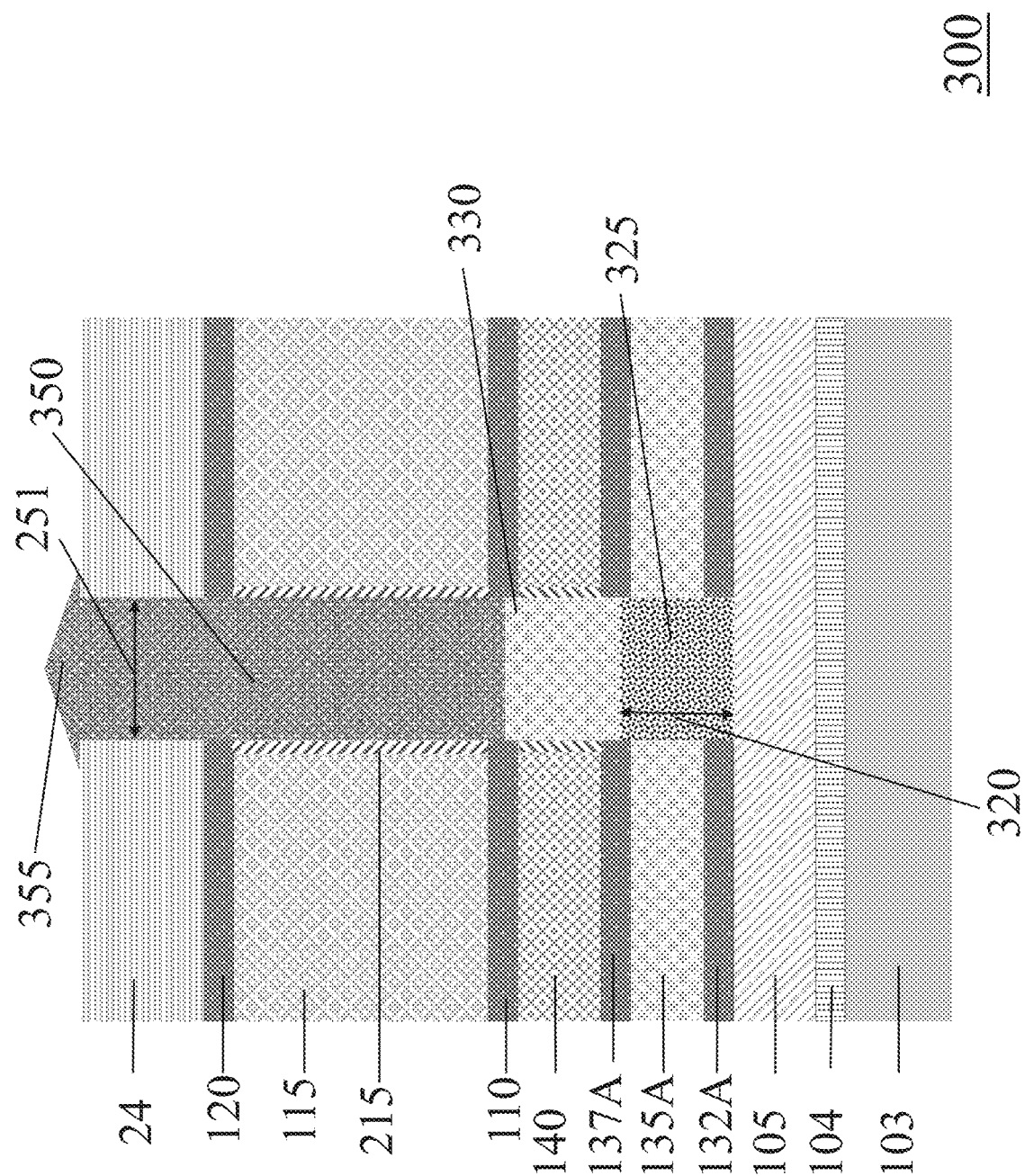
FIG. 3 is a cross section view of an interim multi-layer stack structure of the common-collector circuit embodiment after a resistor body and transistor intrinsic base is grown from the emitter layer surface within the trench.

FIG. 3 is a cross section view of an interim multi-layer stack structure 300 of the common-collector circuit embodiment after a resistor body 325 and transistor base 350 is grown from the emitter layer surface 225 within the trench 250. This growth is an epitaxial growth done in stages. There is no epitaxial growth from the dielectric surfaces, e.g. the side-wall/surfaces 275 of the trench 250, e.g. 132A/135A/137A/240/110/215/120/24.

The terms "epitaxial growth and/or deposition" and "epitaxially formed and/or grown," mean the growth of a semiconductor material (crystalline material) on a deposition surface of another semiconductor material (crystalline material), e.g. the emitter layer 105, in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. The epitaxial deposition process may employ the deposition chamber of a chemical vapor deposition type apparatus, such as a PECVD apparatus.

In some embodiments, the gas source for the deposition of an epitaxially formed in situ doped n-type semiconductor material may include silicon (Si) deposited from silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. In other examples, when the semiconductor material includes germanium (Ge), a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking. An epitaxial silicon germanium alloy layer can be formed utilizing a combination of such gas sources. Carrier gases like hydrogen, nitrogen, or helium can be used.

The body 325 of the passive resistor 325 is epitaxially grown in the trench 250 on the emitter layer surface 225. The epitaxial resistor portion 325 can be made of doped silicon, germanium, or silicon germanium. The doping type is the same as the emitter/collector doping type.

The dimensions, material composition, dopant species, and dopant concentration of the resistor 325 is selected to provide the resistance properties of the resistor 325 for the design parameters of the circuit. The cross-section area, A, of the resistor 325 is determined by the trench width 251. The resistor length, $R_L$, 320 of the resistor 325 is determined by the resistor dielectric layer 135A thickness 136 and, in some embodiments, the resistor lower spacer 132A thickness 131 and the resistor upper spacer 137A thickness 138. Additionally, in-situ carbon doping can be used at tool to fine-tune resistivity, independent of the polarity of the resistor structure.

The cross-section area, A, is perpendicular to the direction of current flow and the resistor length, $R_L$, 320 is in the direction of current flow. The vertical structure 300 allows the resistor length, $R_L$, 320 to be arbitrarily large, while A (e.g., the footprint of the resistor/transistor pair) to be small. Both a large L value and a small A value simultaneously favor a large resistance, R. The resistor length, $R_L$, 320, of the passive resistor 325 can be increased to increase the resistance of the passive resistor 325. The resistor length, $R_L$, 320, can be a function of the length of time of the epitaxial growth process for forming the passive resistor 325.

The resistor cross-section area, A, of the resistor 325 affects the resistance of the resistor 325. The cross-section area, A, is a function of the trench width 215, e.g. between 6 nm and 100 nm, and the length of the trench (not shown), e.g. between 20 nm and 100 nm. The resistor length, $R_L$, 320, is between 10 nm and 200 nm and the resistor 325 is made from the semiconductor materials mentioned above having a with doping type the same as the respective emitter/collector and with a doping concentration between $1\times10^7$ cm$^{-3}$ and $1\times10^{19}$ cm$^{-3}$. Additionally, in-situ carbon doping can be used at tool to fine-tune resistivity, independent of the polarity of the resistor structure. When carbon doping is used, the carbon doping concentration is between $1\times10^{16}$ cm$^{-3}$ and $8\times10^{20}$ cm$^{-3}$.

The resistor typically has a resistor length, $R_L$, 320 extending from the top surface 225 of the emitter layer 105 to the approximate center line (not shown) of the resistor lower spacer 132A. However, the resistor 320 can extend a little below or above the resistor lower spacer 132A in some embodiments. The resistor 325 length, $R_L$, 320 is also determined by the resistor dielectric layer 135A thickness 136.

The resistor 325 has to remain within the lower 132A and upper 137A resistor spacers. In some embodiments, the resistor length, $R_L$, 320, is between 5 nm and 100 nm and the resistance of the resistor is between 10Ω (ohms) and 10 MΩ (mega-ohms). The resistor layer 325 is lightly or moderately doped with a doping level in the range of $10^{17}$ to $10^{19}$ cm$^{-3}$ in some embodiments.

After the resistor 325 has epitaxially grown to the resistor length, $R_L$, 320 (e.g. where the parameters like time and temperature of growth are typically determined experimentally), the epitaxial growth conditions change to form the first doped epitaxy region 330. The first doped epitaxy region 330 later will serve as part of an external electrical connection to a voltage output produced across the resistor 325.

The first doped epitaxy layer 330 is made of a semiconductor material (e.g. silicon, or silicon-germanium) that is high doped with the polarity of doping as the emitter/collector doping type and with a doping concentration of between $4\times10^{20}$ cm$^{-3}$ and $1.5\times10^{21}$ cm$^{-3}$. Accordingly, the first doped epitaxy layer 330 is highly conductive. In some embodiments, the doping concentration of the first doped epitaxy layer 330 is graded, with doping levels in the range of $4\times10^{20}$ cm$^{-3}$ and $1.5\times10^{21}$ cm$^{-3}$ in the vicinity of the first resistive region 1625, and relatively lower doping levels in the range of $10^{19}$ and $4\times10^{20}$ cm$^{-3}$ in the vicinity of the intrinsic base region 350 (e.g. to reduce bandgap narrowing and Auger recombination within the doped epitaxy layer in the vicinity of the intrinsic base region 350, as known in the art). Similarly, the doping concentration of the second doped epitaxy layer 2130 may be graded, with doping levels in the range of $4\times10^{21}$ cm$^{-3}$ and $1.5\times10^{21}$ cm$^{-3}$ in the vicinity of the second resistive region 2125, and relatively lower doping levels in the range of $10^{19}$ and $4\times10^{20}$ cm$^{-3}$ in the vicinity of the intrinsic base region 350. (Refer to the description of FIG. 21 below.)

The first doped epitaxy layer 330 continues to grow to fill the region in the trench 250 approximately between the resistor upper spacer 137A and the base lower layer spacer 110. As a result, the first doped epitaxy layer 330 has a thickness approximately equal to the resistor dielectric layer 135A thickness 136. At this point in the process, the first doped epitaxy layer 330 is in contact with the thin oxide layer 240.

After the first doped epitaxy region 330 is grown, the epitaxial gas chemistry is changed in-situ to grow the intrinsic base 350 which continues to grow in the trench 250. The intrinsic base material 350 grows filling the remainder of the trench 250 until the intrinsic base material 350 forms a base cap 355 over the top surface of the cap dielectric layer 24.

The intrinsic base 350 is made of a semiconductor material like silicon (Si), silicon-germanium (SiGe), that is lightly or moderately doped with a dopant type opposite to that of the emitter 105, collector 1050, first doped epitaxy 330, second doped epitaxy 2130, first resistive region 1625 and resistive region 2125, and with a doping concentration between $10^{17}$ and $10^{19}$ cm$^{-3}$ in some embodiments. (Refer to the description of FIGS. 16 and 21 below.)

For example, in one embodiment where the bipolar junction transistor is an n-p-n transistor, the emitter 105, collector 1050, first doped epitaxy 330, second doped epitaxy 2130, first resistive region 1625 and resistive region 2125, are doped n-type, whereas the intrinsic base 350 and the extrinsic base 650 are doped p-type. In another embodiment where the bipolar junction transistor is a p-n-p transistor, the emitter 105, collector 1050, first doped epitaxy 330, second doped epitaxy 2130, first resistive region 1625 and resistive region 2125, are doped p-type, whereas the intrinsic base 350 and the extrinsic base 650 are doped n-type. In preferred embodiments, the intrinsic base 350 is comprised of a material having a lower bandgap than that of the first and/or second doped epitaxy regions 330 and 2130. For example, the intrinsic base 350 may be comprised of SiGe with a higher Ge content than that of the doped epitaxy regions 330 and 2130. As known in the art, a relatively lower bandgap is desired for the intrinsic base to improve transistor gain, reduce switching voltage and/or enhance carrier collection.

In some embodiments, the intrinsic base material 350 is made of a material that is latticed matched to the emitter layer 105. In some embodiments, the emitter layer 105 is made of silicon (Si), the collector 1050 is made of silicon (Si), (see FIG. 10 description), and the intrinsic base material 350 is made of silicon-germanium (SiGe).

As disclosed, the dopant and dopant concentration used to create the epitaxial growth of the resistor 325 may be selected to provide the resistive properties of the passive resistor 325 then changed to form the first doped epitaxy region 330, then changed again to form the intrinsic base 350 with the appropriate semiconductor properties. The parameters of the epitaxial growth for each of these regions 325/330/350, e.g. growth time, temperature, etc. is determined by experimentation.

The passive resistor 325, first doped epitaxy region 330, and intrinsic base 350 can be epitaxially grown in the trench 250 using the same epitaxial deposition chamber. The epitaxial growth within the trench 250 creates a monolithic structure 325/330/350. Here the term "monolithic" denotes that the passive resistor 325, first doped epitaxy region 330, and intrinsic base material 350 are composed of the same semiconductor material, albeit with different doping levels.

Being grown within the trench 250, the resistor 325, the first doped epitaxy region 330, and the intrinsic base 350 are in vertical alignment and therefore the cross-section area, A, is minimized for each device on the surface of the supporting substrate 103.

Figure 4:
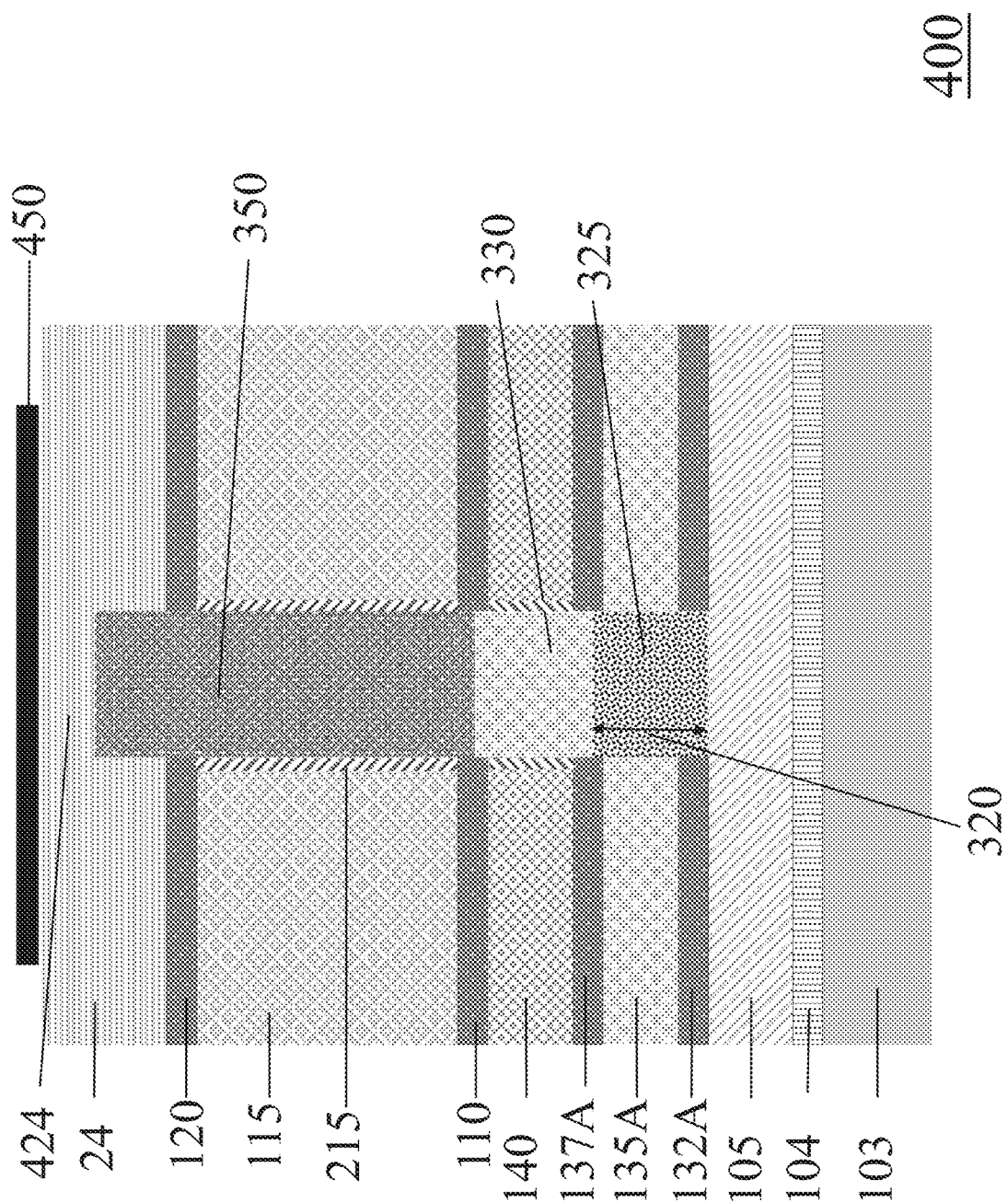
FIG. 4 is a cross section view of an interim multi-layer stack structure of the common-collector circuit embodiment after addition of dielectric to a cap dielectric layer, a chemical-mechanical polishing, and deposition of a base mask.

FIG. 4 is a cross section view of an interim multi-layer stack structure 400 of the common-collector circuit embodiment after removal of the base cap 355 (e.g. by a chemical-mechanical polishing, CMP), adding more dielectric 424 to the cap dielectric layer 24 (to form a thicker cap dielectric layer), performing another CMP, and depositing a base mask 450.

CMP techniques are known. The dielectric 424 added to the top of the cap dielectric layer 24 can be any dielectric. In some embodiments, the dielectric is same dielectric 424 as that of the cap dielectric layer 24 deposited by methods described above.

The base mask 450 is a hard mask. The base mask 450 covers the trench 250/intrinsic base 350 and extends over to cover part of the dummy layer 115 around the trench 250/intrinsic base 350.

The base mask 450 is made of a protective, dielectric material, e.g. a lithographic protective material, including but not limited to any one of the following materials: silicon nitride (SiN), siliconborocarbonitride (SiBCN), silicon oxycarbonitride (SiOCN), and silicon oxynitride (SiON). The base mask 450 is deposited by standard techniques including CVD, PVD, ALD, and/or other lithographic processes.

Figure 5:
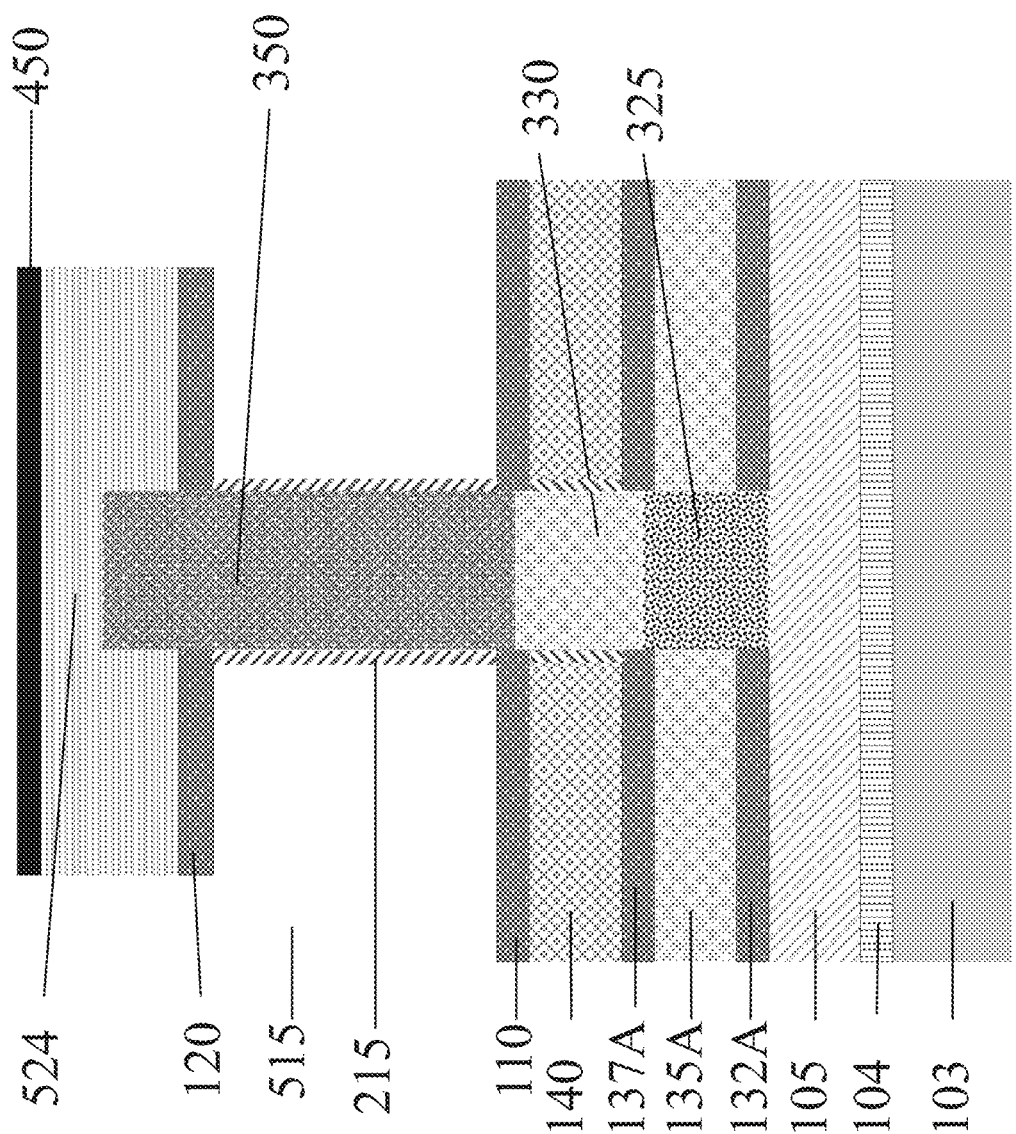
FIG. 5 is a cross section view of an interim multi-layer stack structure of the common-collector circuit embodiment after removal of a dummy layer.

FIG. 5 is a cross section view of an interim multi-layer stack structure of the common-collector circuit embodiment 500 after a directional etch and removal of the dummy layer 115, leaving a voided region 515.

The directional etch, e.g. a first base directional etch, uses known chemistries to remove material that is not protected by the base mask 450 to form a narrower cap dielectric layer 524 region below the base mask 450 and to narrow the base upper layer spacer 120. Material in the dummy layer 115 not protected by the base mask 450 may or may not be removed by the base directional etch but the first base direction etch will not proceed past the base lower spacer 110.

In some embodiments, a dummy etch is then performed that removes the remaining material in the dummy layer 115 but is selective (does not substantially remove) the cap dielectric layer 524, base upper layer spacer 120, thin oxide layer 215, and base lower spacer 110. The second etch leaves a void 515 in place of the dummy layer 115.

The first base directional etch and the dummy etch can be performed in either order.

Figure 6:
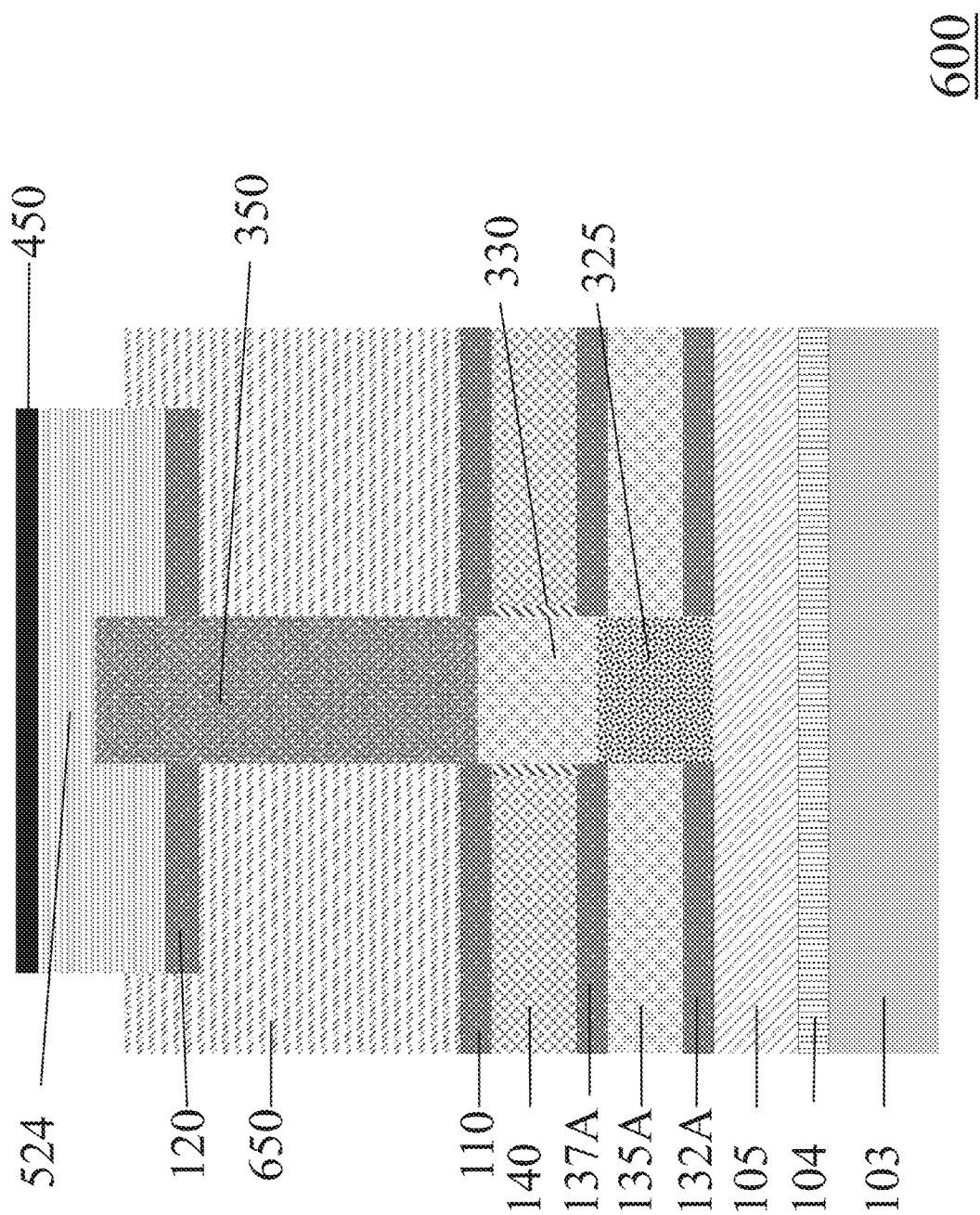
FIG. 6 is a cross section view of an interim multi-layer stack structure of the common-collector circuit embodiment after removal of a thin oxide layer and an epitaxial growth of an extrinsic base layer.

FIG. 6 is a cross section view of an interim multi-layer stack structure of the common-collector circuit embodiment 600 after removal of a thin oxide layer 215 and an epitaxial growth of an extrinsic base layer 650.

The thin oxide liner 215 can be removed using a dry etch, (e.g. a SiCoNi™ etch), a short hydrofluoric acid (HF) etch, or any other suitable pre-clean process.

The extrinsic base layer 650 is epitaxially grown on the intrinsic base 350 and fills the void 515 left by the removal of the dummy layer 115.

Due to the shape and access to the void 515 and the epitaxial growth along multiple spacer 110/120 surfaces the epitaxy will be defective, containing dislocations and stacking faults. That will not diminish the function as an extrinsic base material, since typical extrinsic bases of BJT are formed by polycrystalline semiconductor materials. The grown defective epitaxial material will resemble polycrystalline properties, but with much larger grains (areas of perfect epitaxy), accordingly forming a large grain polycrystalline material (LGP) extrinsic base layer 650. Therefore, in some embodiments, the extrinsic base layer 650 is a polycrystalline material 650 that may contain defects such as large grains in the many crystal structure 40, e.g. forming a large grain polycrystalline material (LGP) extrinsic base layer 650.

In some embodiments, the extrinsic base 650 is an in situ doped epitaxy. The extrinsic base 650 may have a doping level in the range of $10^{19}$ and $4\times10^{20}$ cm$^{-3}$. In preferred embodiments, the extrinsic base 650 is comprised of a material with higher bandgap than that of the intrinsic base 350. For example, when the intrinsic base 350 is comprised of SiGe, the extrinsic base 650 may be comprised of polysilicon. As known in the art, a higher bandgap for the extrinsic base 650 compared to that of the intrinsic base 350 may be beneficial in reducing the base current and therefore improving the transistor gain in some embodiments.

Figure 7:
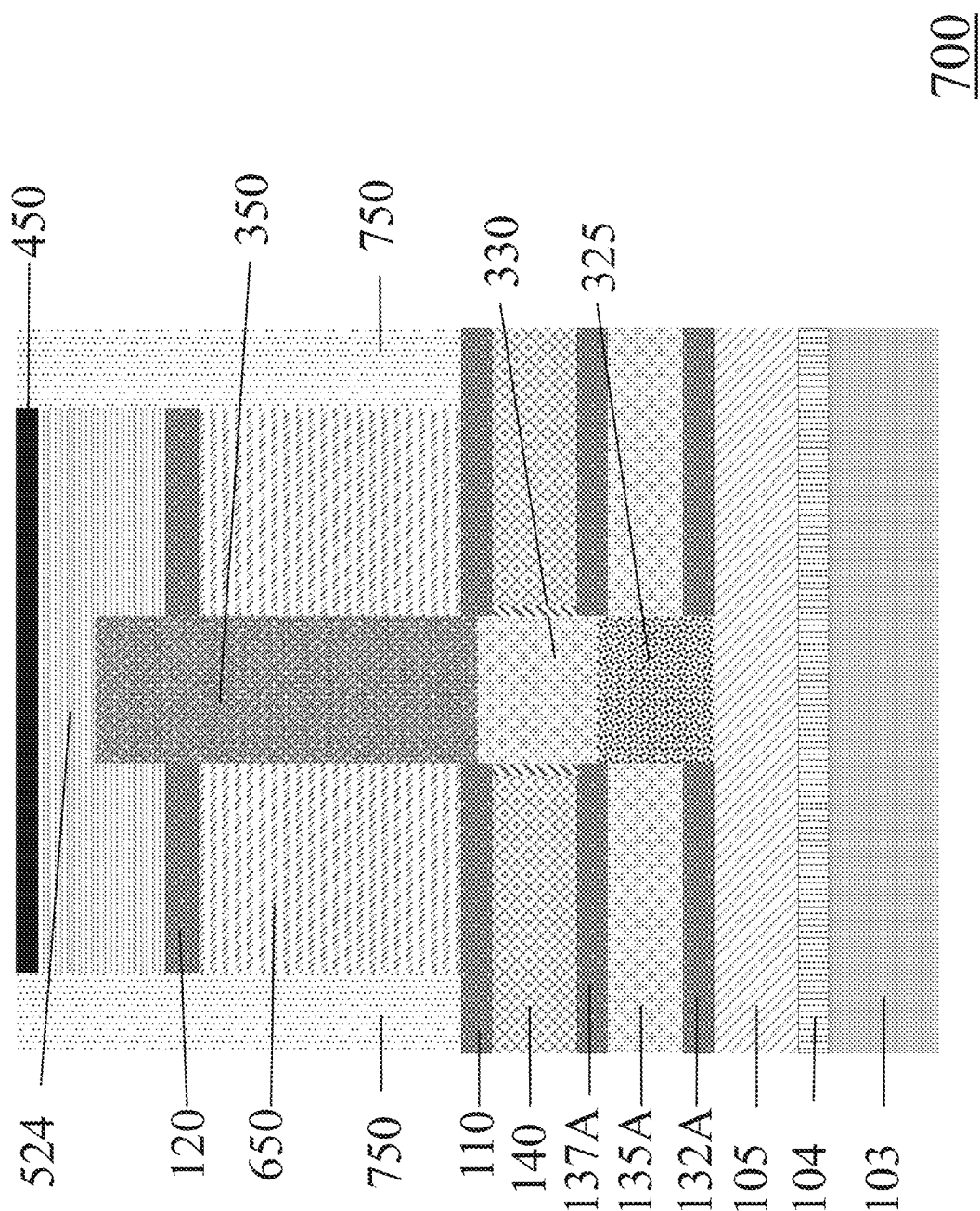
FIG. 7 is a cross section view of an interim multi-layer stack structure of the common-collector circuit embodiment after a base masked etch and deposition of an interlayer dielectric (IDL).

FIG. 7 is a cross section view of an interim multi-layer stack structure of the common-collector circuit embodiment 700 after a second base directional etch. The second base directional etch removes some of the extrinsic base layer 650 material not protected by the base mask 450. As a result, the sides of the cap dielectric layer 524, base upper layer spacer 120, and extrinsic base layer 650 are surfaces in the same plane determined by the shape of the base mask 450.

After the second base direction etch, an interlayer dielectric (ILD) 750 material is deposited to fill any remaining spaces in the structure 700. The ILD 750 is made from, for example, a low-k dielectric material (with k<4.0), including but not limited to, silicon oxide, spin-on-glass, a flowable oxide, a high-density plasma oxide, borophosphosilicate glass (BPSG), or any combination thereof. The ILD 750 is deposited by a deposition process, including, but not limited to CVD, PVD, PECVD, ALD, evaporation, chemical solution deposition, or like processes.

Figure 8:
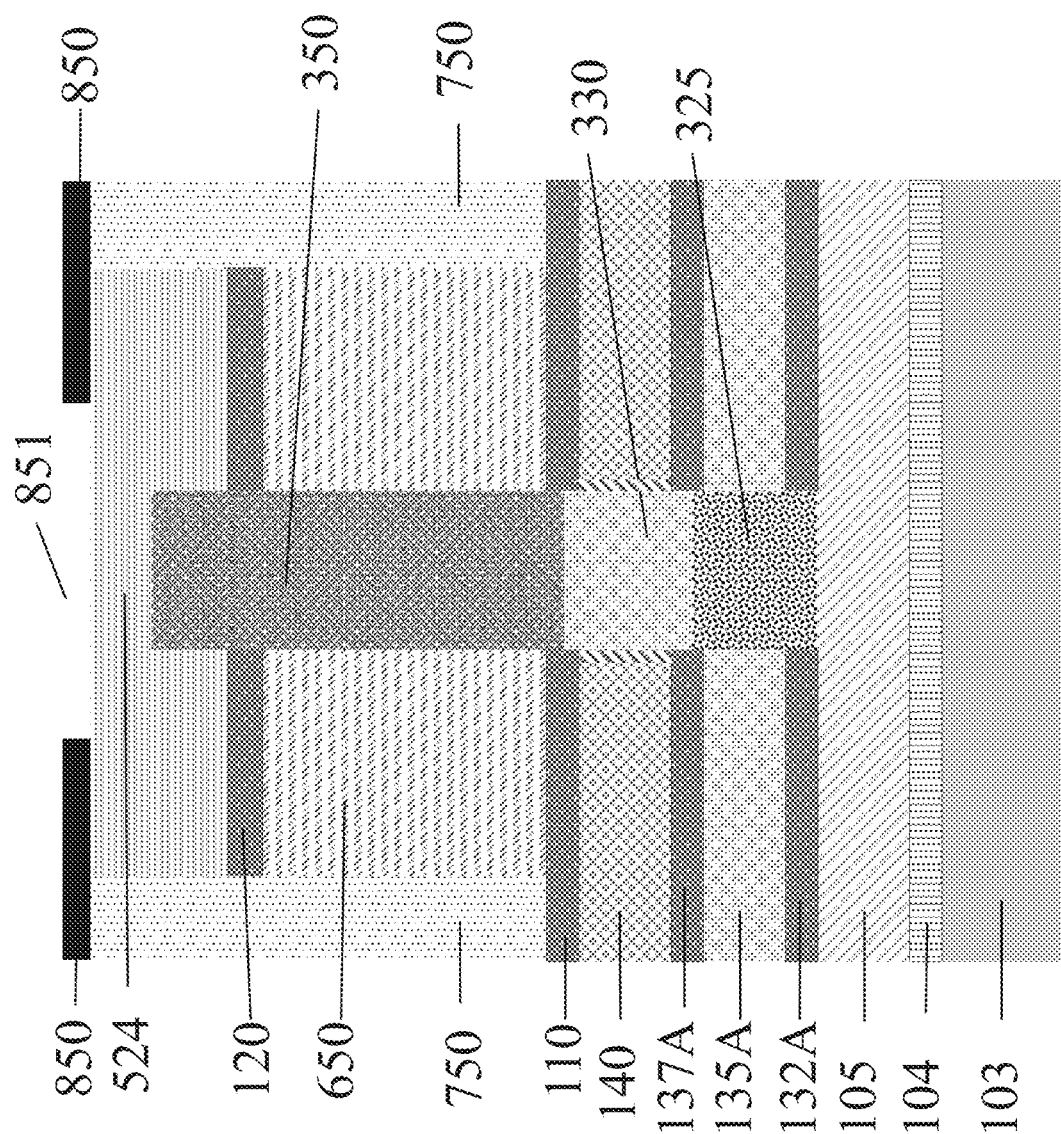
FIG. 8 is a cross section view of an interim multi-layer stack structure of the common-collector circuit embodiment after removal of the base region hard mask and deposition of a collector mask.

FIG. 8 is a cross section view of an interim multi-layer stack structure of the common-collector circuit embodiment 800 after removal of the base mask 450 (and some of the IDL 750 top surface) and deposition of a collector mask 850. The collector mask 850 has a collector mask opening 851 approximately centered over the intrinsic base 350.

The base mask 450 is removed by known techniques like a CMP or a masked etch.

The collector mask 850 is a hard mask and can be made of the same materials and deposited by the methods as the base mask 450.

Figure 9:
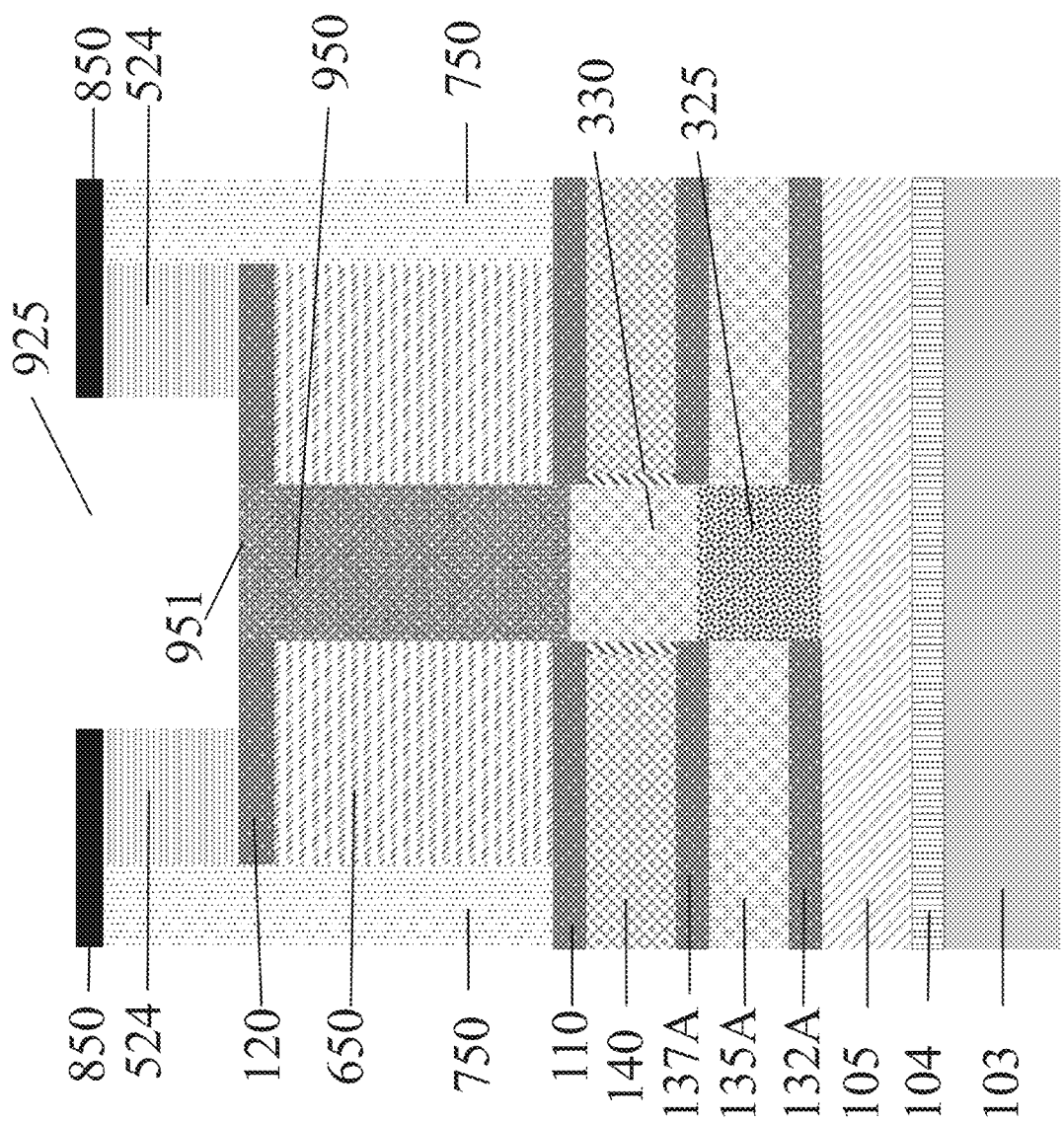
FIG. 9 is a cross section view of an interim multi-layer stack structure of the common-collector circuit embodiment after a collector masked etch.

FIG. 9 is a cross section view of an interim multi-layer stack structure of the common-collector circuit embodiment 900 after a collector masked etch.

The collector masked etch creates a collector cavity 925 by removing material from the cap dielectric layer 524 and part of the intrinsic base 350 in a region not protected by the collector mask 850. A shorter intrinsic base 950 results with a base top surface 951 exposed to the collector cavity 925. The collector masked etch is selective to the base upper layer spacer 120.

Figure 10:
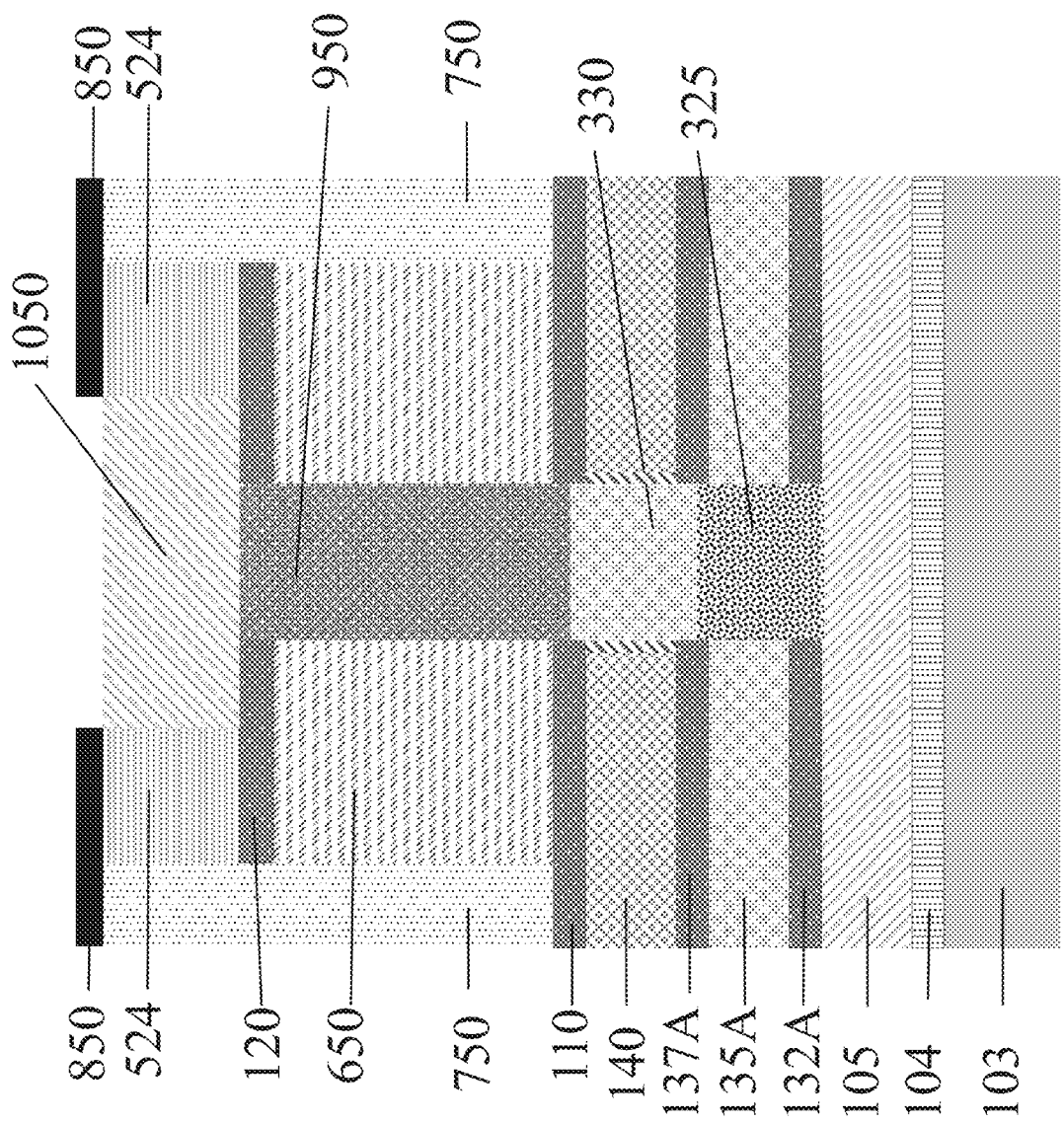
FIG. 10 is a cross section view of an interim multi-layer stack structure of the common-collector circuit embodiment after deposition of a collector.

FIG. 10 is a cross section view of an interim multi-layer stack structure of the common-collector circuit embodiment 1000 after deposition of a collector 1050.

The collector 1050 is epitaxially grown, to fill the collector cavity 925 and contacts the base top surface 951 of the intrinsic base 950. The collector 1050 can be made of any known collector material compatible with the intrinsic base 950 and is deposited by known techniques like those described above, e.g. CVD and PVD.

In some embodiments, the collector 1050 is made from a doped silicon doped with a dopant type of the same as the emitter layer 105 and a dopant concentration of between $4 \times 10^{20}$ cm; and $2.5 \times 10^{21}$ cm$^{-3}$.

Figure 11:
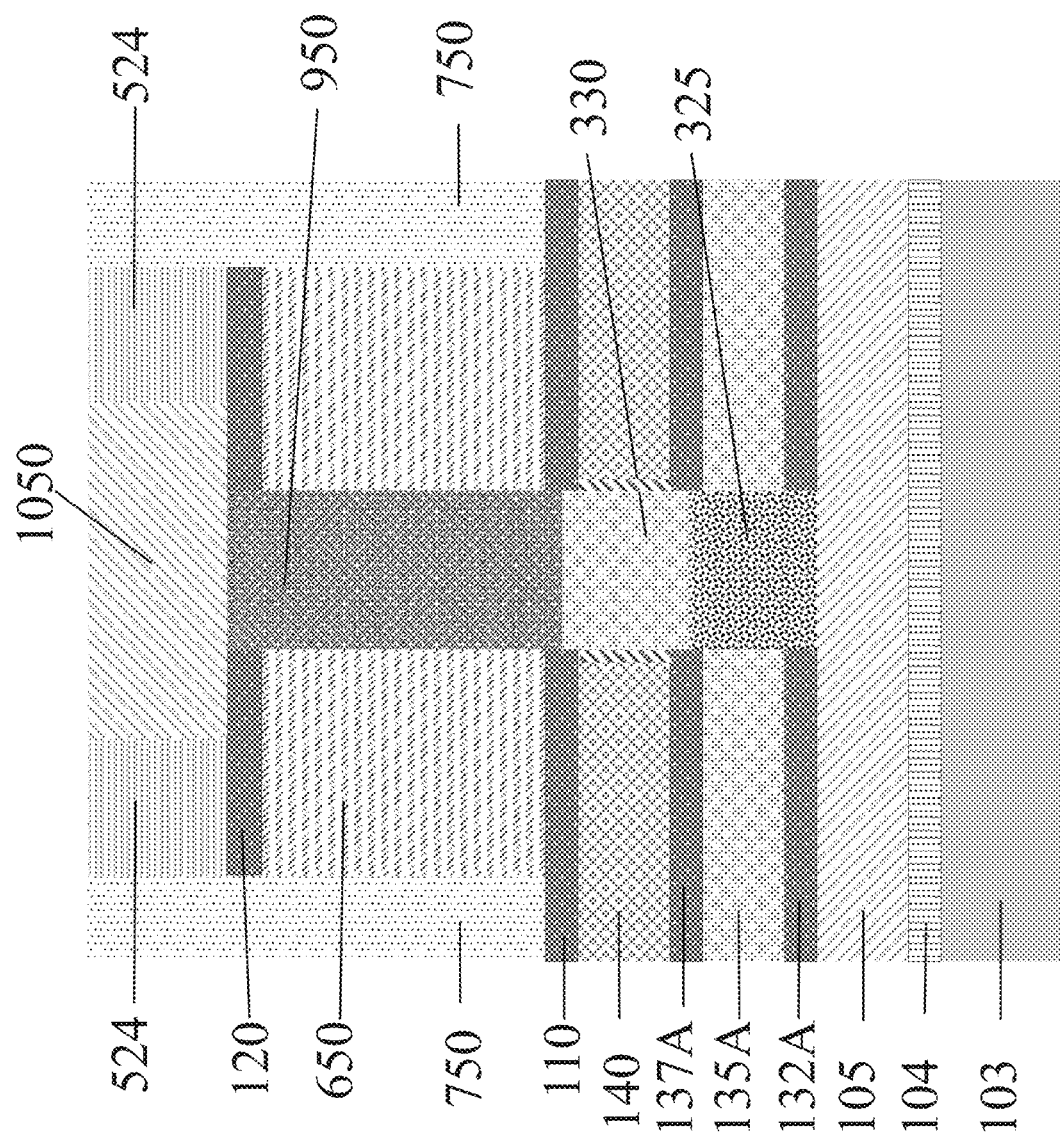
FIG. 11 is a cross section view of an interim multi-layer stack structure of the common-collector circuit embodiment after removal of the collector mask.

FIG. 11 is a cross section view of an interim multi-layer stack structure of the common-collector circuit embodiment 1100 after removal of the collector mask 850 by known methods like a CMP or a masked etch.

Figure 12:
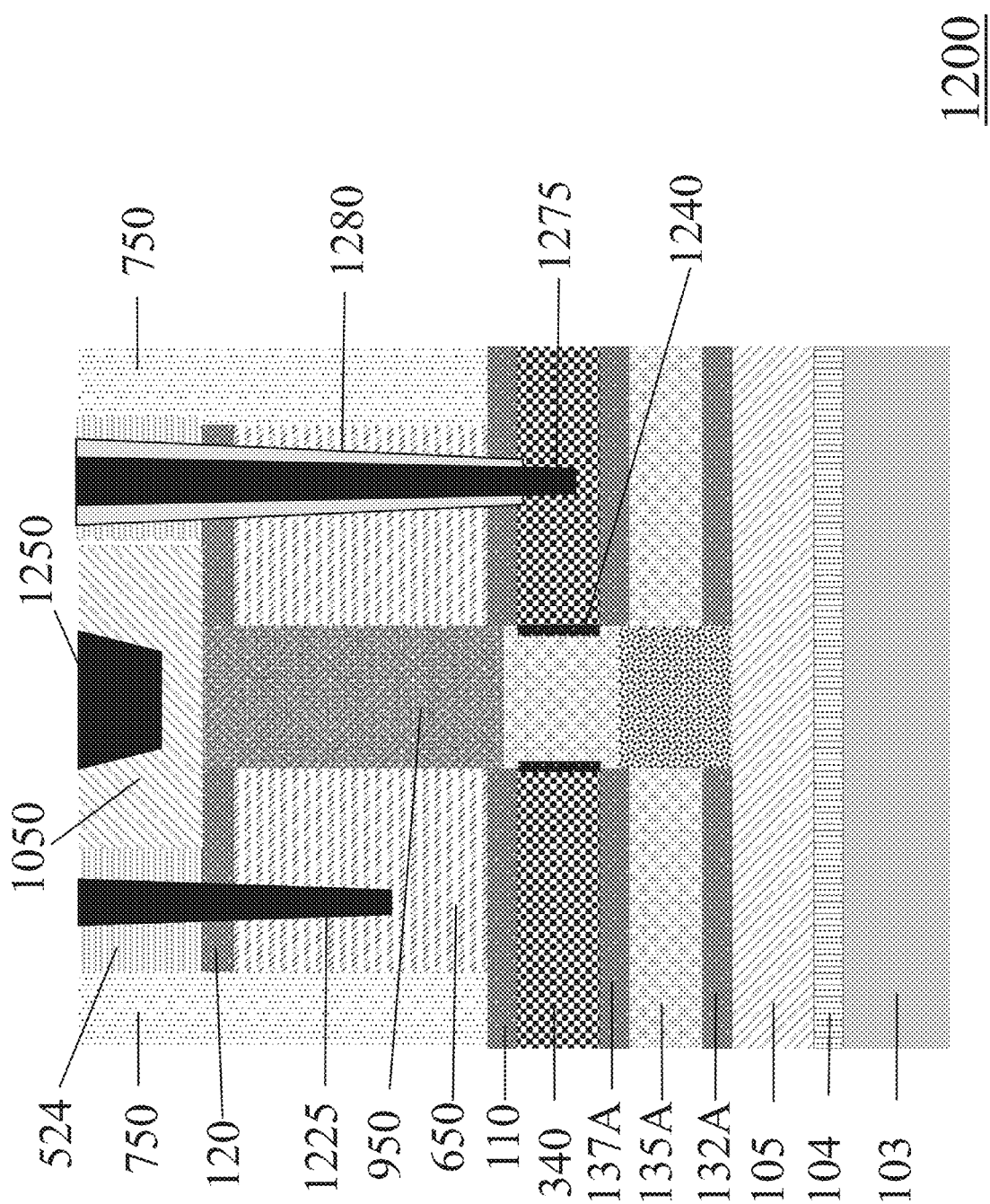
FIG. 12 is a cross section view of a common-collector circuit embodiment of a vertical BJT with a stacked vertical resistor including external contacts.

FIG. 12 is a cross section view of a common-collector circuit embodiment of a vertical BJT with a stacked vertical resistor 1200 including external contacts 1225/1250/1275.

The external contacts 1225/1250/1275 are made with known methods. Non-limiting methods of forming external contacts 1225/1250/1275 include forming a via, e.g. with a laser, patterning one or more trenches with a masked etch, etc.

The dummy contact layer 140 and the thin oxide layer 240 are removed and replaced with a metal contact layer 340.

In some embodiments, the dummy contact layer 140 is removed from between the resistor upper spacer 137A and the base lower layer spacer 110 by a wet etch using hot ammonia. The etching material contacts the dummy contact layer 140 through one or more drilled holes and/or by lateral access. The wet etch removes the dummy contact layer 140 selectively while leaving resistor upper spacer 137A, the base lower layer spacer 110, and the thin oxide layer 240 substantially intact. The thin oxide liner 240 is then removed using a dry etch, (e.g. a SiCoNi™ etch), a short hydrofluoric acid (HF) etch, or any other suitable pre-clean process. A SiCoNi™ etch is a plasma-assisted dry etch process that involves simultaneous exposure of a substrate to hydrogen, NF$_3$ and NH$_3$ plasma by-products.

Accordingly, a cavity is formed, bordered by the resistor upper spacer 137A, the base lower layer spacer 110, and the first doped epitaxy region 330. After a silicide, typically 1240, is formed on the first doped epitaxy region 330, the cavity left by the dummy contact layer 140 removal is filled with a metal to create the metal contact layer 340. Non-limiting examples of metals making the metal contact layer 340 are cobalt (Co), or tungsten (W), and other metals like nickel (Ni), platinum (Pt), titanium (Ti), and molybdenum (Mo) which are deposited by known deposition techniques like CVD, PVD, ALD, etc. The metal contact layer 340 is in direct contact with the silicide layer 1240 which is in direct contact with the surface of the first doped epitaxy region 330.

The vias/trenches are long enough to electrically connect to the respective internal contact of the device 1200 to external circuitry. Removal of material from the cap dielectric layer 524, base upper layer spacer 120, collector 1050, extrinsic base layer 650, base lower spacer 110, and/or metal contact layer 340 creates the respective via/trench.

The base contact 1225 passes through the cap dielectric layer 524 and base upper layer spacer 120 to contact the extrinsic base layer 650 and base 950. The collector contact 1250 directly contacts the collector 1050. The output contact 1275 contacts the metal contact layer 340. Note that an insulating layer 1280 is first deposited in via containing the output contact 1275 to prevent the output contact 1275 from electrical shorting to the extrinsic base layer 650.

The vias/trenches are filled with a conductive material, e.g., a metal, or a combination of conductive materials. Non-limiting examples of conductive material are a conductive metal, aluminum (Al), platinum (Pt), gold (Au), tungsten (W), titanium (Ti), cobalt (Co) or any combination thereof. The conductive material may be deposited by a suitable deposition process, for example, CVD, PECVD, PVD, plating, thermal or e-beam evaporation, or sputtering.

Figures 13A, 13B:
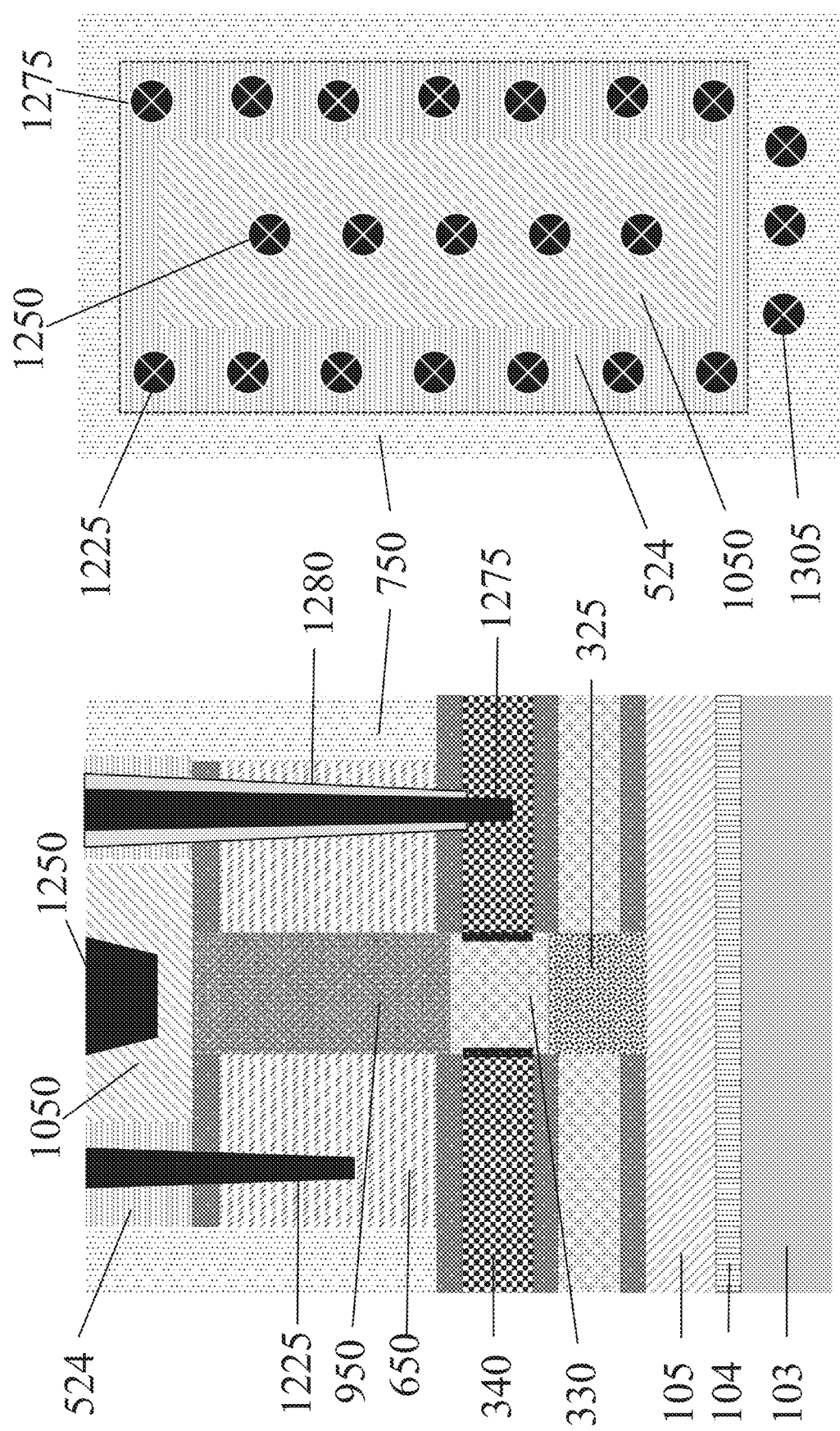
FIG. 13A is a cross section view of a common-collector circuit embodiment of a vertical BJT with a stacked emitter resistor.
FIG. 13B is a top view of the common-collector circuit embodiment of the vertical BJT with a stacked emitter resistor shown in FIG. 13A.

FIG. 13A is a cross section view of a common-collector circuit embodiment 1300 of a vertical BJT with a stacked emitter resistor 325. The contacts 1225/1250/1275 are made as described above.

FIG. 13B is a top view of the common-collector circuit embodiment 1350 of the vertical BJT with a stacked emitter resistor 1300 shown in FIG. 13A. In some embodiments, the collector contact 1250 can be a single contact or a plurality of contacts 1250, as shown. In some embodiments, the base contacts 1225 are multiple contacts 1225 on one side of the structure 1300/1350 and the output contacts 1275 are multiple contacts 1275 on another side of the structure 1300/1350, as shown. In some embodiments, the emitter contacts 1305 are multiple contacts in the front and/or the back of the structure 1300/1350 as shown in the top view 1350 but not visible in the cross-section view 1300.

Figure 14:
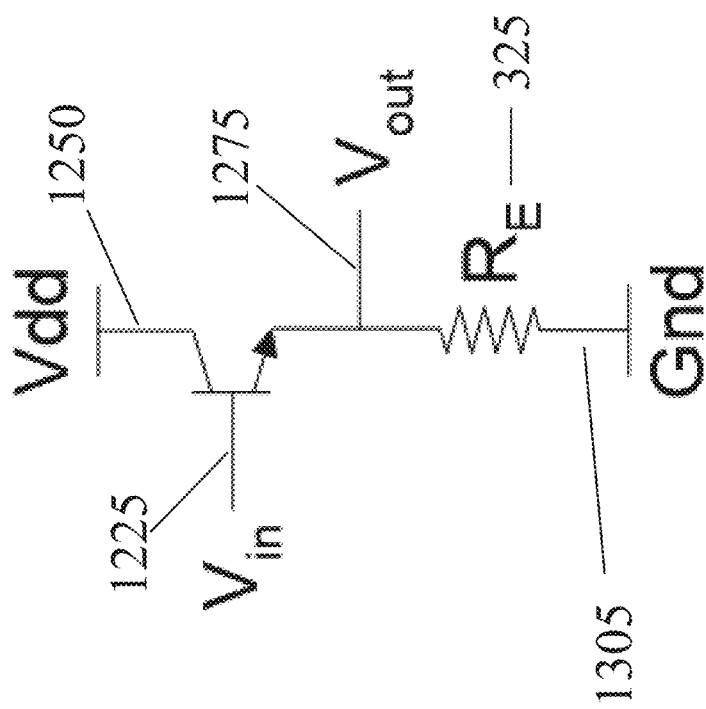
FIG. 14 is a circuit diagram of the common-collector circuit embodiment of a vertical BJT with a stacked emitter resistor.

FIG. 14 is a circuit diagram of the common-collector circuit embodiment of a vertical BJT with a stacked emitter resistor 1400.

The circuit input, Vin, is the external base connection 1225 and the circuit output, Vout, is external connection 1275. In this circuit, the external emitter connection 1305 is connected to ground (or alternatively, to the emitter supply voltage Vss). The external collector connection 1250 is connected to the collector supply voltage Vdd.

FIG. 15 is a cross section view of an interim multi-layer stack structure used to form a resistor (e.g. resistor) vertically stacked with a bipolar junction transistor (BJT) in a common-emitter circuit embodiment 1500.

The layers in the common-emitter embodiment of the interim multi-layer stack structure 1500 are the same as those in the common-collector embodiment 100, however the order is different. As with the common-collector embodiment 100, there is an emitter substructure 103/104/105. However, in the common-emitter embodiment 1500, the "tri-layer dummy stack" 110/115/120 is deposited on the emitter substructure first. The dummy contact layer 140 is deposited on the tri-layer dummy stack, e.g. on the base upper spacer 120. The interim resistor substructure 132B/135B/137B is deposited on the dummy contact layer 140. The cap dielectric layer 24 is deposited on the interim resistor substructure 132B/135B/137B, e.g. on and the resistor upper spacer 137B. See the description of FIG. 1 for the material composition, thicknesses, and methods of deposition of these layers.

Figure 16:
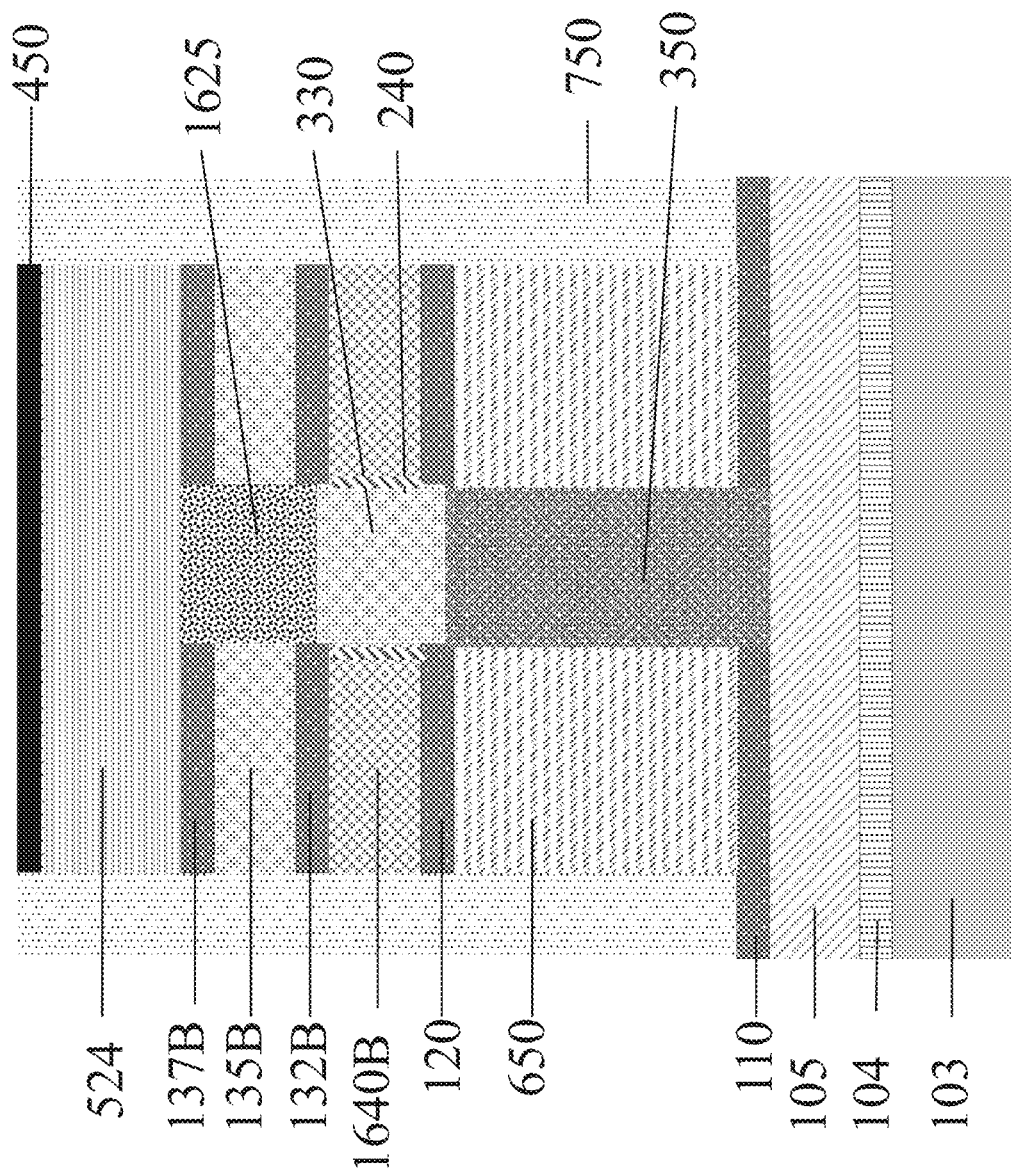
FIG. 16 is a cross section view of an interim multi-layer stack structure used to form a passive resistor (e.g. resistor) vertically stacked with a bipolar junction transistor (BJT) in the common-emitter circuit embodiment after formation of intrinsic and extrinsic base and collector resistor.

FIG. 16 is a cross section view of an interim multi-layer stack structure used to form a passive resistor (e.g. resistor) vertically stacked with a bipolar junction transistor (BJT) in the common-emitter circuit embodiment 1600 after formation of intrinsic 350 and extrinsic base and resistor 1625.

This structure 1600 is formed by performing the steps of etching the trench 250 and oxidizing the thin oxide layers 215/240. The trench/opening 250 is then filled by an epitaxial growth in the following epitaxial deposition time-controlled formation order: intrinsic base 350, first doped epitaxy region 330, and collector resistor 1625. The base mask 450 is deposited.

A directional etch is performed, e.g. a first base/collector directional etch, using known chemistries to remove material that is not protected by the base mask 450. The first base/collector direction etch removes material down/selective to the base lower spacer 110.

In some embodiments, a dummy etch is then performed that removes the remaining material in the dummy layer 115 but is selective (does not substantially remove) the cap dielectric layer 524, base upper layer spacer 120, thin oxide layer 215, and base lower spacer 110. The second etch leaves a void in place of the dummy layer 115. The thin oxide layer 215 is removed.

The extrinsic base layer 650 is epitaxially grown on the intrinsic base 350 and fills the void left by the removal of the dummy layer 115. The ILD 750 is deposited.

See the description of FIGS. 2-7 for more detail about the materials used and process steps performed to create structure 1600.

Figure 17:
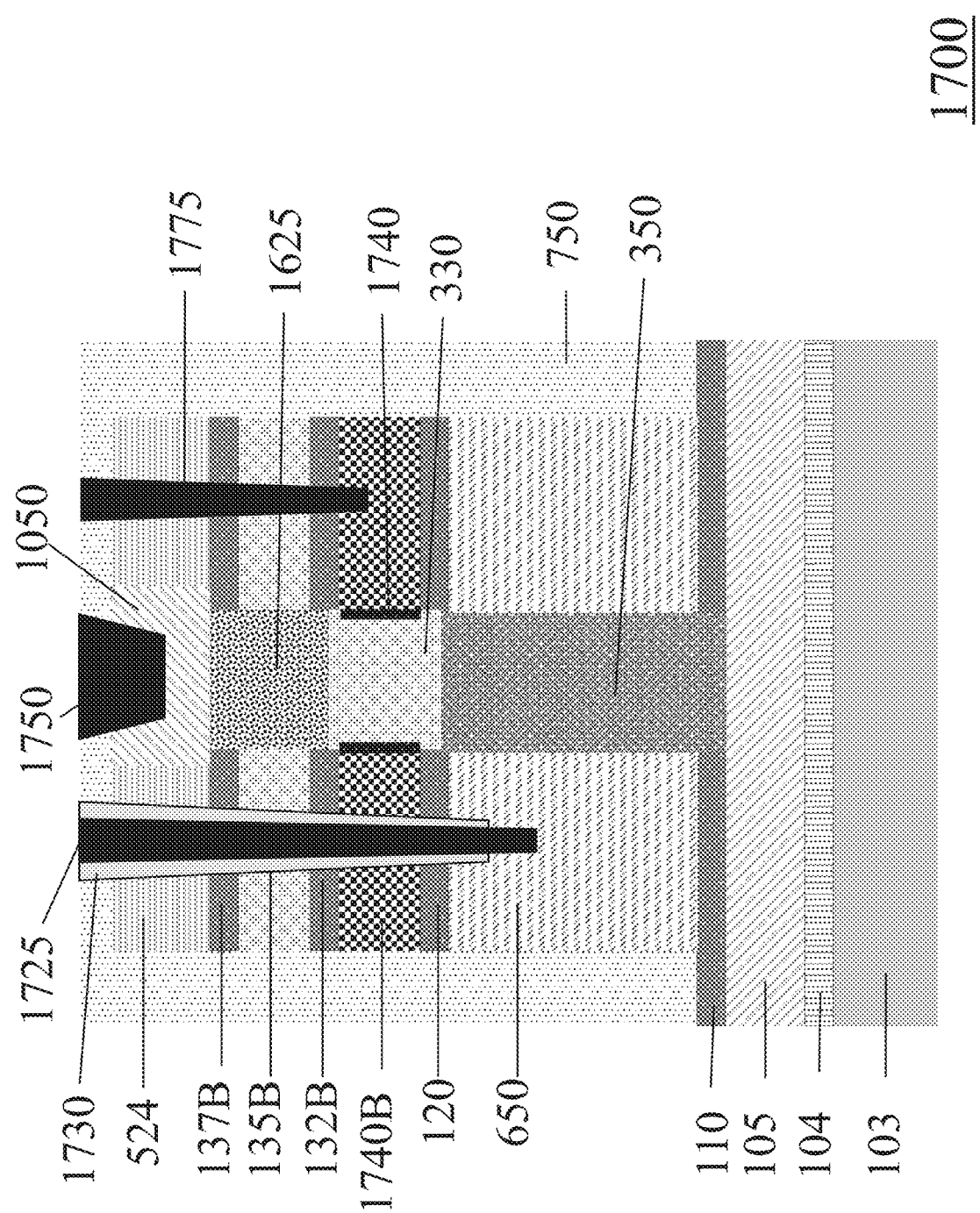
FIG. 17 is a cross section view of a common-emitter circuit embodiment of a vertical BJT with a stacked vertical collector resistor including external contacts.

FIG. 17 is a cross section view of a common-emitter circuit embodiment of a vertical BJT with a stacked vertical collector resistor 1700 including external contacts.

Starting with the structure 1600, the base mask 450 is removed and collector mask 850 is deposited. The collector cavity 925 is formed and the collector 1050 is epitaxially grown. The collector mask 850 is then removed. The dummy contact layer 1640B is removed and the silicide, typically 1740, is formed. The metal contact layer 1740B replaces the void left by the removed dummy contact layer 1640B and the external contacts 1725/1750/1775/1805 are formed.

The base contact 1725 passes through the cap dielectric layer 524, the resistor upper spacer 137A, the resistor dielectric layer 135B, the resistor lower spacer 132B, the metal contact layer 1740B, and the base upper layer spacer 120 to contact the extrinsic base layer 650 and base 350. Note that an insulating layer 1730 is first deposited in via/trench containing the base contact 1725 to prevent the base contact 1725 from electrical shorting to the metal contact layer 1740B.

The collector contact 1750 directly contacts the collector 1050. The output contact 1775 contacts the metal contact layer 1740B.

See the description of FIGS. 8-12 for more detail about the materials used and process steps.

Figures 18A, 18B:
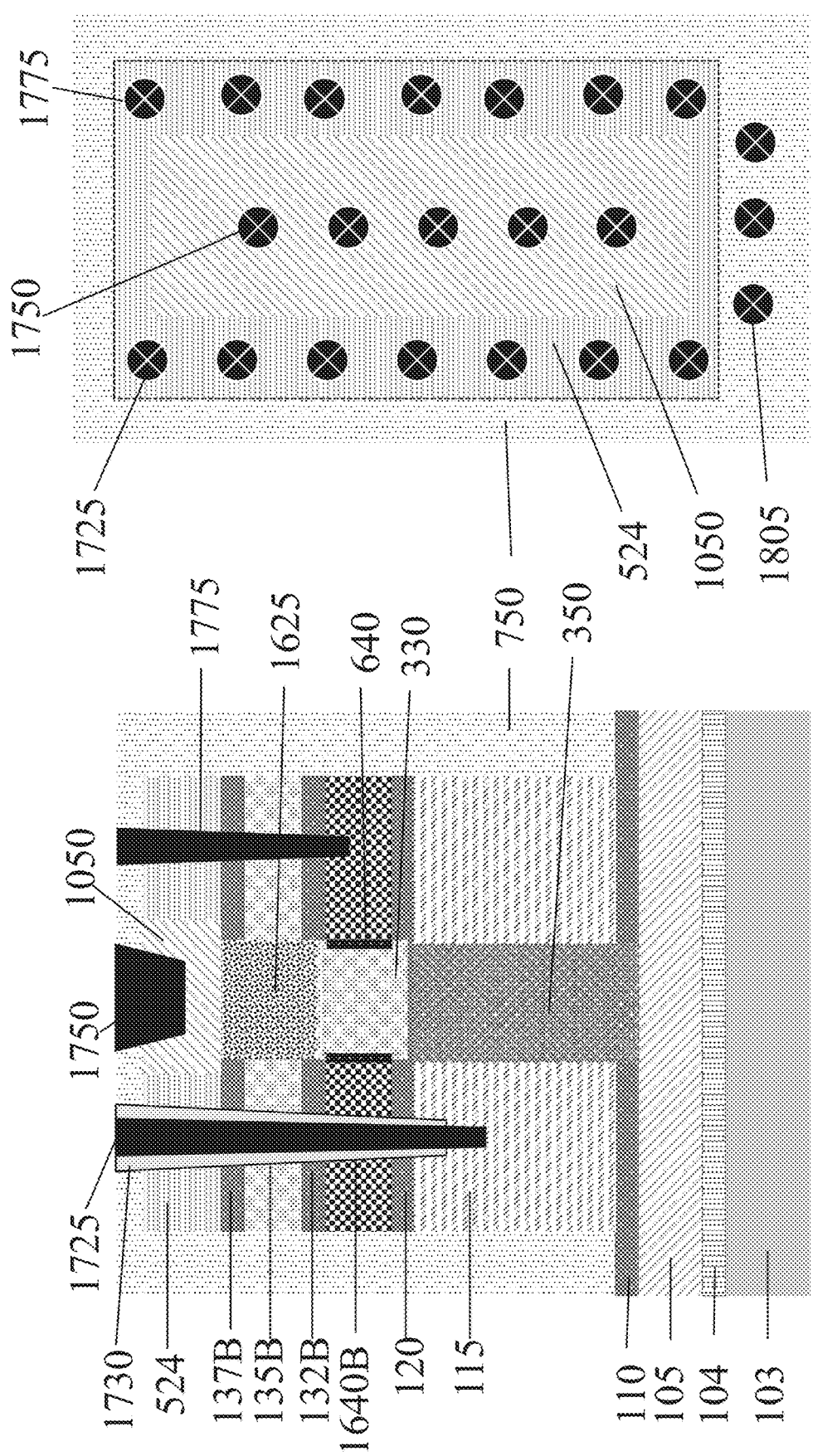
FIG. 18A is a cross section view of a common-emitter circuit embodiment of a vertical BJT with a stacked collector resistor.
FIG. 18B is a top view of the common-emitter circuit embodiment of the vertical BJT with a stacked collector resistor shown in FIG. 18A.

FIG. 18A is a cross section view of a common-emitter circuit embodiment of a vertical BJT with a stacked collector resistor 1800.

The contacts 1725/1750/1775 are made as described above.

FIG. 18B is a top view of the common-emitter circuit embodiment of the vertical BJT with a stacked emitter resistor 1850 shown in FIG. 18A.

In some embodiments, the collector contact 1750 can be a single contact or a plurality of contacts 1750, as shown. In some embodiments, the base contacts 1725 are multiple contacts 1725 on one side of the structure 1800/1850 and the output contacts 1775 are multiple contacts 1775 on another side of the structure 1800/1850, as shown. In some embodiments, the emitter contacts 1805 are multiple contacts in the front and/or the back of the structure 1800/1850 as shown in the top view 1850 but not visible in the cross-section view 1800 and connect to emitter layer 105.

Figure 19:
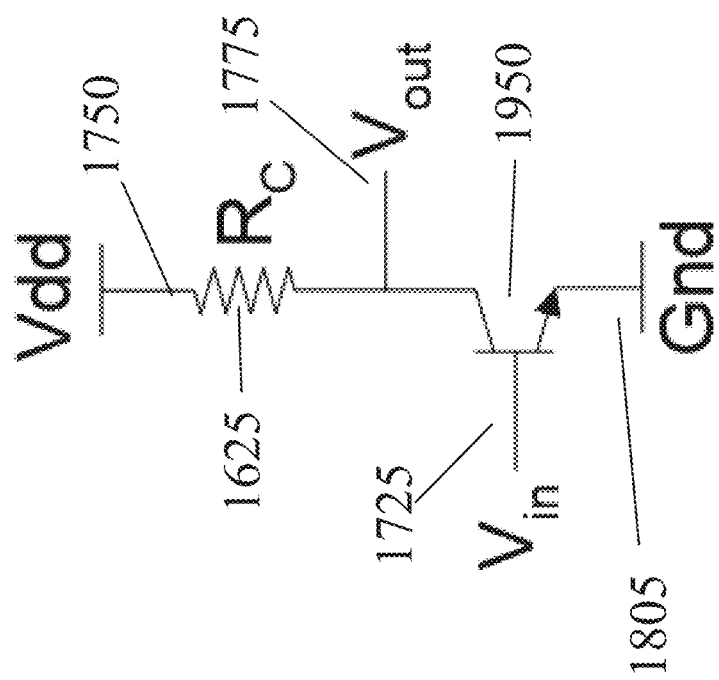
FIG. 19 is a circuit diagram of the common-emitter circuit embodiment of a vertical BJT with a stacked collector resistor.

FIG. 19 is a circuit diagram of the common-emitter circuit embodiment of a vertical BJT with a stacked collector resistor 1900.

The circuit input, Vin, is the external base connection 1725 and the circuit output, Vout, is external connection 1775. In this circuit, the external emitter connection 1805 is connected to ground (or alternatively, to the emitter supply voltage such as Vss). The collector resistor, Rc, 1625 is connected 1750 to the collector supply voltage Vdd.

FIG. 20 is a cross section view of an interim multi-layer stack structure 2000 used to form an upper/collector and a lower/emitter resistors vertically stacked with a bipolar junction transistor (BJT) in a emitter-degenerate circuit embodiment. Adding an emitter degeneracy to a common-emitter circuit (i.e. adding $R_E$) reduces the voltage gain but increases the linearity and stability of the circuit.

The layers in the emitter-degenerate embodiment of the interim multi-layer stack structure 2000 are the same as those in the common-emitter embodiment 1500, however, a first/emitter resistor lower spacer 2032 and a first/emitter resistor dielectric layer 2035 are inserted between the emitter layer 105 and the tri-layer dummy stack 110/115/120. The first/emitter resistor lower spacer 2032 is disposed on emitter layer 105 and the first/emitter resistor dielectric layer 2035 is disposed on the first/emitter resistor layer spacer 2032. The first/emitter resistor dielectric layer 2035 will become the emitter resistor Re.

The "tri-layer dummy stack" 110/115/120 is deposited on the first resistor dielectric layer 2035. The dummy contact layer 140 is deposited on the tri-layer dummy stack, e.g. on base upper spacer 120. The interim resistor substructure 132B/135B/137B is deposited on the dummy contact layer 140. The cap dielectric layer 24 is deposited on the interim resistor substructure 132B/135B/137B, e.g. on and the resistor upper spacer 137B. See the description of FIG. 1 for the material composition, thicknesses, and methods of deposition of these layers.

Figure 21:
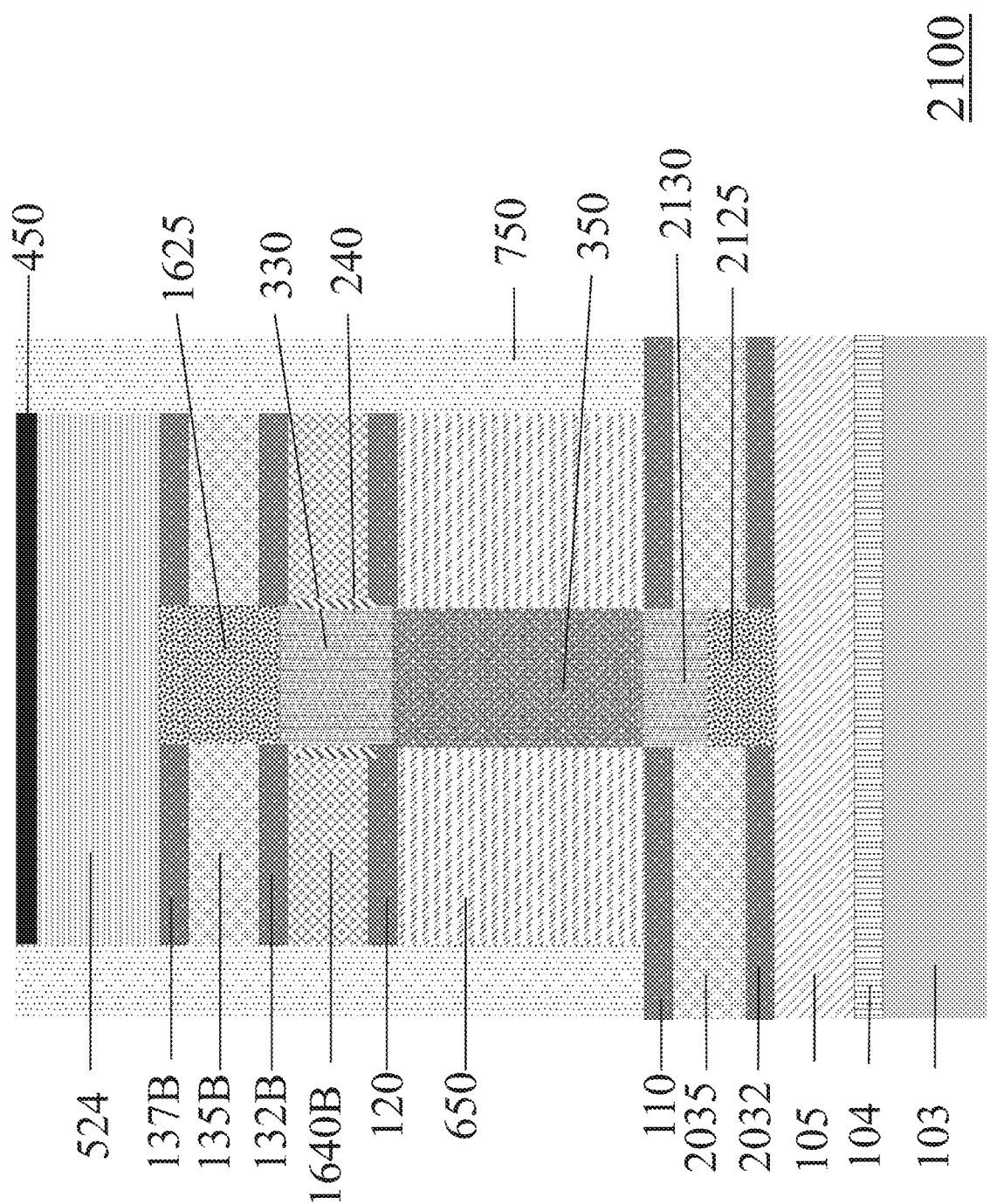
FIG. 21 is a cross section view of an interim multi-layer stack structure used to form the two resistors vertically stacked in a channel with a bipolar junction transistor (BJT) in the emitter-degenerate circuit embodiment.

FIG. 21 is a cross section view of an interim multi-layer stack structure used to form the two resistors vertically stacked with a bipolar junction transistor (BJT) in the emitter-degenerate circuit embodiment 2100 after formation of intrinsic 350 and extrinsic base 650 and first/emitter resistor, Re, 2125 and the second/collector resistor, Rc 1625.

This structure 2100 is formed by performing the steps of etching the trench 250 down to the base lower spacer 110 and oxidizing the thin oxide layers 215/240. The trench 250 etch then continues until the emitter layer 105 is reached.

The trench 250 is then filled with an epitaxial growth in the following formation order: first/emitter resistor, Re, 2125, bottom doped epitaxy region 2130, intrinsic base 350, top doped epitaxy region 330, and second/collector resistor 1625. The base mask 450 is deposited.

A directional etch is performed, e.g. a first base/collector directional etch, using known chemistries to remove material that is not protected by the base mask 450. The first base/collector direction etch removes material down/selective to the base lower spacer 110.

In some embodiments, a dummy etch is then performed that removes the remaining material in the dummy layer 115 but is selective (does not substantially remove) the cap dielectric layer 524, base upper layer spacer 120, thin oxide layer 215, and base lower spacer 110. The second etch leaves a void in place of the dummy layer 115. The thin oxide layer 215 is removed.

The extrinsic base layer 650 is epitaxially grown on the intrinsic base 350 and fills the void left by the removal of the dummy layer 115. The ILD 750 is deposited.

See the description of FIG. 2-7 for more detail about the materials used and process steps performed to create structure 2100.

In some embodiments, the materials and methods are the same for the first/emitter resistor, Re, 2125, and the second/collector resistor 1625. In addition, the materials and methods are the same for the bottom doped epitaxy region 2130 and the top doped epitaxy region 330. No silicide contacts need to be form on the bottom doped epitaxy region 2130.

Figure 22:
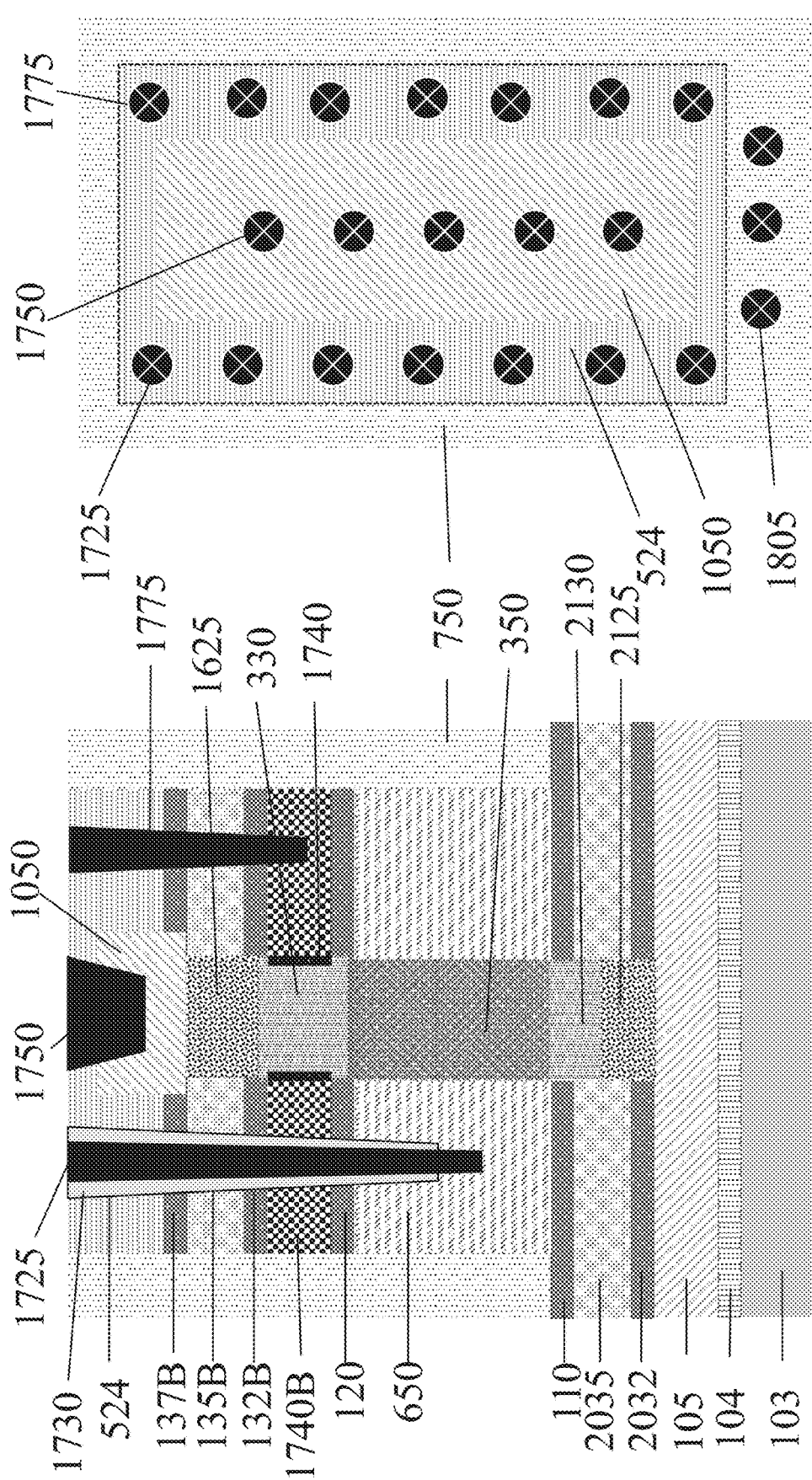
FIG. 22A is a cross section view of an emitter-degenerate circuit embodiment of a vertical BJT with a stacked first/emitter resistor, Re, a stacked second/collector resistor, Rc, and external connections.
FIG. 22B is a top view of an emitter-degenerate circuit embodiment of FIG. 22A.

FIG. 22A is a cross section view of a emitter-degenerate circuit embodiment 2200 of a vertical BJT with a stacked first/emitter resistor, Re, 2125 and the second/collector resistor, Rc 1625 completed and with the external connections 1730/1750/1775/1805, metal contact layer 1740B, and silicide 1740 included.

Starting with the structure 2100, the base mask 450 is removed and collector mask 850 is deposited. The collector cavity 925 is formed and the collector 1050 is deposited. The collector mask 850 is then removed, the dummy contact layer 1640B is removed, and the silicide, typically 1740, is formed. The metal contact layer 1740B fills the void left by the dummy contact layer 1640B removal and the external contacts 1725/1750/1775/1805 are completed.

The base contact 1725 passes through the cap dielectric layer 524, the resistor upper spacer 137A, the resistor dielectric layer 135B, the resistor lower spacer 132B, the metal contact layer 1740B, and the base upper layer spacer 120 to contact the extrinsic base layer 650 and base 350. Note that an insulating layer 1730 is first deposited in via/trench containing the base contact 1725 to prevent the base contact 1725 from electrical shorting to the metal contact layer 1740B.

The collector contact 1750 directly contacts the collector 1050. The output contact 1775 contacts the metal contact layer 1740B.

See the description of FIGS. 8-12 for more detail about the materials used and the method steps performed.

FIG. 22B is a top view of the common-emitter circuit embodiment of the vertical BJT with a with a stacked first/emitter resistor, Re, 2125 and the second/collector resistor, Rc 1625.

In some embodiments, the collector contact 1750 can be a single contact or a plurality of contacts 1750, as shown. In some embodiments, the base contacts 1725 are multiple contacts 1725 on one side of the structure 2200/2250 and the output contacts 1775 are multiple contacts 1775 on another side of the structure 2200/2250, as shown. In some embodiments, the emitter contacts 1805 are multiple contacts in the front and/or the back of the structure 2200/2250 that connect to emitter layer 105, as shown in the top view 2250 but not visible in the cross-section view 2200.

Figure 23:
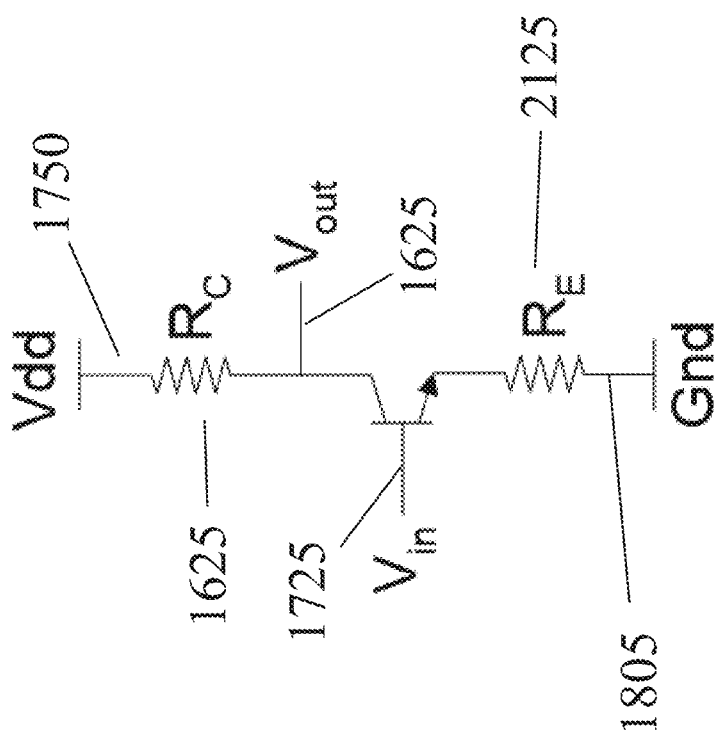
FIG. 23 is a circuit diagram of the emitter-degenerate circuit embodiment of a vertical BJT with a stacked first/emitter resistor, Re, and the second/collector resistor, Rc.

FIG. 23 is a circuit diagram 2300 of the emitter-degenerate circuit embodiment 2200 of a vertical BJT with a stacked first/emitter resistor, Re, 2125 and the second/collector resistor, Rc 1625.

The circuit input, Vin, is the external base connection 1725 and the circuit output, Vout, is external connection 1775. In this circuit, the external emitter connection 1805 is connected to ground (or to the emitter supply voltage Vss). The collector resistor, Rc, 1625 is connected 1750 to the collector supply voltage Vdd.

Figure 24:
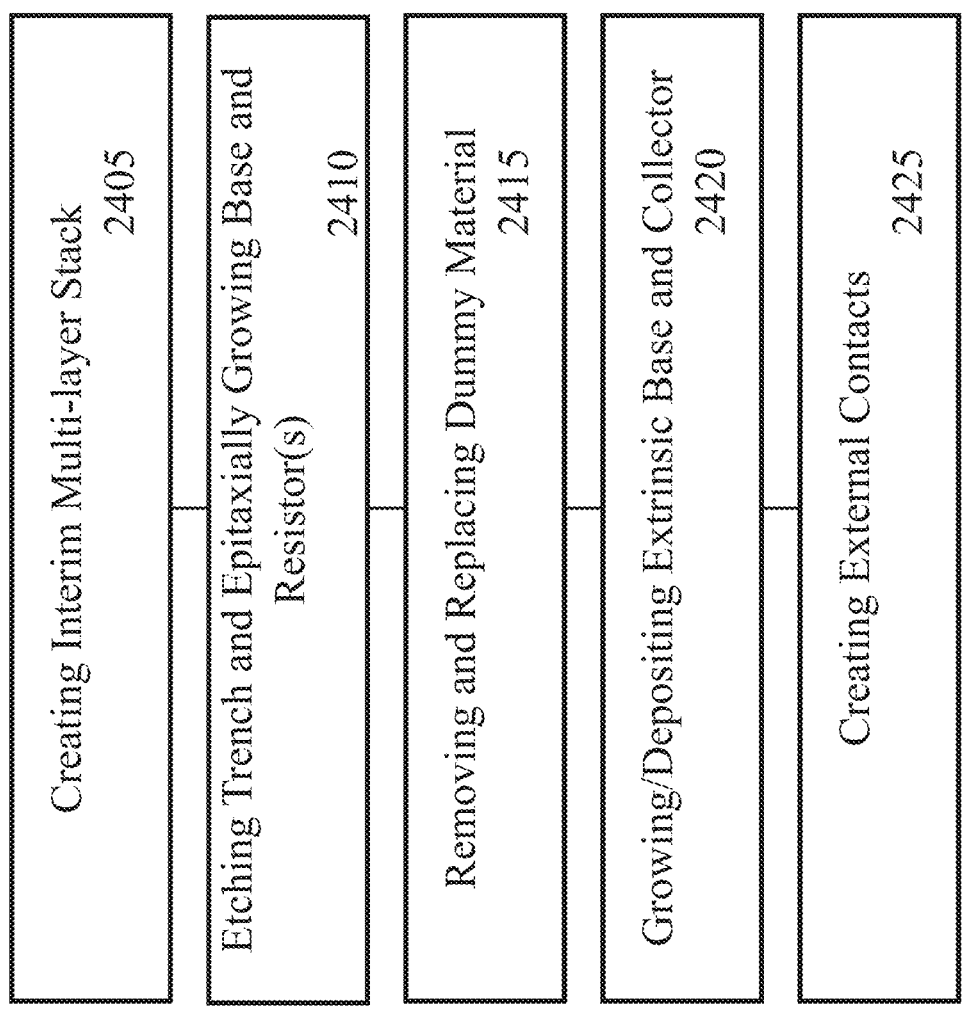
FIG. 24 is a flow chart of a process of making a vertical BJT with one or more stacked resistors.

FIG. 24 is a flow chart of a process 2400 of making a vertical BJT with one or more stacked resistors.

The process begins with step 2405 by creating an interim multi-layer stack 100/1500/2000 depending on the respective circuit embodiments that are being made, e.g. common-collector, a common-emitter, or an emitter-degenerate circuit. See the descriptions in FIGS. 1, 15, and 20.

In step 2410, the trench 250 is etched and epitaxial growth of the layers in the trench forms the first/emitter resistor, Re, 2125, bottom doped epitaxy region 2130, intrinsic base 350, top doped epitaxy region 330, and/or the second/collector resistor 1625. See the respective descriptions of FIGS. 2-3, 16, and 21.

In step 2515, dummy material is removed and replaced. For example, the dummy contact layer 140 is removed and replaced with metal contact layer 340/1740B and the dummy layer 115 is removed and replaced with the extrinsic base layer 650. See description of FIGS. 3A through 7, 16, 21, and 22A.

In step 2420 the extrinsic base 640 is grown and the collector 1050 is deposited. See the description in FIGS. 7-11, 17, and 22A.

In step 2425, the external contacts are formed. See descriptions of FIGS. 12, 13A, 13B, 17, 18A, 18B, 22A, and 22B.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A vertical bipolar junction transistor (VBJT) comprising:
   an emitter substructure, the emitter substructure having an emitter layer made from an emitter semiconductor;
   a collector made of a collector semiconductor;
   an intrinsic base, the intrinsic base made of one of a lightly doped or moderately doped semiconductor;
   one or more doped epitaxy regions made of a highly doped semiconductor; and
   one or more resistors,
   wherein the intrinsic base, the doped epitaxy region, and the resistors are stacked upon one another in a channel between the emitter layer and the collector.

2. The VBJT, as in claim 1, where doped epitaxy regions have a doping concentration of between $4 \times 10^{20}$ cm$^{-3}$ and $2.5 \times 10^{21}$.

3. The VBJT, as in claim 1, where the emitter semiconductor is doped with an n-type dopant with an emitter dopant concentration between $4 \times 10^{20}$ cm$^{-3}$ and $2.5 \times 10^{21}$ cm$^{-3}$.

4. The VBJT, as in claim 1, where an extrinsic base made of an extrinsic base semiconductor and surrounds the intrinsic base.

5. The VBJT, as in claim 1, further comprising one or more metal contact layers each metal contact layer encompassing one or more of the doped epitaxy regions and one or more of the metal contact layers being connected to an external connection.

6. The VBJT, as in claim 1, where a resistor dielectric thickness of the resistor determines a resistor length of the respective resistor.

7. The VBJT, as in claim 6, where the resistor length is between 5 nanometers (nm) and 100 nm.

8. The VBJT, as in claim 1, where the resistor has resistor dopant with a resistor dopant concentration between $1 \times 10^{17}$ cm$^{-3}$ and $1 \times 10^{19}$ cm$^{-3}$ and is made of one of the following materials: a type IV semiconductor, silicon, germanium, silicon-germanium, and a type III semiconductor.

9. The VBJT, as in claim 8, where resistor dopant type is the same dopant type used in the emitter layer and collector.

10. The VBJT, as in claim 8, where the resistor has a carbon doping in addition.

11. The VBJT, as in claim 9, where the carbon doping has a carbon doping concentration between $1 \times 10^{17}$ and $8 \times 10^{20}$ cm$^{-3}$.

12. The VBJT, as in claim 1, where the doped epitaxy region is bottom doped epitaxy region and the resistor is an emitter resistor and the emitter resistor is disposed on the emitter layer, the emitter bottom doped epitaxy region is disposed on the emitter resistor, and the intrinsic base is disposed on the emitter resistor to form a common-collector VBJT circuit.

13. The VBJT, as in claim 1, where the doped epitaxy region is a top doped epitaxy region and the resistor is a collector resistor and the intrinsic base is disposed on the emitter layer, the top doped epitaxy region is disposed on the intrinsic base, and the collector resistor is disposed on the top doped epitaxy region to form a common-emitter VBJT circuit.

14. The VBJT, as in claim 1, where the one or more doped epitaxy regions comprise a bottom doped epitaxy region and a top doped epitaxy region and the one or more resistor that comprise an emitter resistor and a collector resistor and the emitter resistor disposed on the emitter layer, the bottom doped epitaxy region is disposed on the emitter resistor dielectric, the intrinsic base is disposed on the bottom doped epitaxy region, the top doped epitaxy region is disposed on the intrinsic base, and the collector resistor is disposed on the top doped epitaxy region to form a emitter-degenerate circuit VBJT circuit.

15. A vertical bipolar junction transistor (VBJT) emitter-degenerate circuit comprising:
   an emitter substructure, the emitter substructure having an emitter layer made from an emitter semiconductor;
   an emitter resistor disposed on the emitter layer;
   a bottom doped epitaxy region disposed on the emitter resistor;
   an intrinsic base disposed on the bottom doped epitaxy region, the intrinsic base made of one of an undoped semiconductor or a lightly doped semiconductor;
   a top doped epitaxy region disposed on the intrinsic base
   a collector resistor disposed on the top doped epitaxy region; and
   a collector made of a collector semiconductor, disposed on the collector resistor,
   wherein the emitter resistor, the bottom doped epitaxy region, the intrinsic base, the top doped epitaxy region, and the collector resistor are stacked in a channel between the emitter layer and the collector.

16. The VBJT emitter-degenerate circuit, as in claim 15, wherein the emitter resistor, the bottom doped epitaxy region, the top doped epitaxy region, the collector resistor, and the collector are all doped with the same dopant type.

17. A vertical bipolar junction transistor (VBJT) comprising:
   an emitter substructure, the emitter substructure having an emitter layer made from an emitter semiconductor;
   a collector made of a collector semiconductor;
   an intrinsic base, the intrinsic base made of one of a lightly doped or moderately doped semiconductor, and the intrinsic base being between the emitter and the collector; and
   one or more of the following: (a) a top doped epitaxy region and a collector resistor, the top doped epitaxy region being in contact with the intrinsic base and the collector resistor and being between the intrinsic base and the collector resistor and (b) a bottom doped epitaxy region and an emitter resistor, the bottom doped epitaxy region being in contact with the intrinsic base and the emitter resistor and being between the intrinsic base and the emitter resistor.

18. The vertical bipolar junction transistor (VBJT), as in claim 17, where an extrinsic base made of an extrinsic base semiconductor and surrounds the intrinsic base.

19. The vertical bipolar junction transistor (VBJT), as in claim 18, where the extrinsic base and the intrinsic base are doped with the same dopant type.

20. The vertical bipolar junction transistor (VBJT), as in claim 17, where the intrinsic base is made of a material having a lower bandgap than the material of which the top doped epitaxy region and the bottom doped epitaxy region are made.

* * * * *